(12) United States Patent
Yokozeki et al.

(10) Patent No.: US 6,898,224 B2
(45) Date of Patent: May 24, 2005

(54) SEMICONDUCTOR LASER DEVICE

(75) Inventors: Mikihiro Yokozeki, Tokyo (JP);
Kaname Saito, Tokyo (JP); Hirotatsu Ishii, Tokyo (JP); Masayuki Iwami, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 10/219,093

(22) Filed: Aug. 13, 2002

(65) Prior Publication Data

US 2003/0043872 A1 Mar. 6, 2003

(30) Foreign Application Priority Data

Aug. 22, 2001 (JP) ........................................ 2001-251364

(51) Int. Cl.[7] .............................................. H01S 5/00
(52) U.S. Cl. ........................................... 372/43; 372/49
(58) Field of Search ............................ 372/44–46, 49, 372/50, 43

(56) References Cited

U.S. PATENT DOCUMENTS

| 5,486,490 | A | * | 1/1996 | Kakimoto | .................... | 438/33 |
| 5,962,873 | A | * | 10/1999 | Ohkubo et al. | ................ | 372/45 |
| 6,396,864 | B1 | * | 5/2002 | O'Brien et al. | ................ | 372/49 |
| 6,566,688 | B1 | * | 5/2003 | Zhang et al. | .................. | 257/85 |
| 2001/0006840 | A1 | * | 7/2001 | Takahashi | ................... | 438/483 |

FOREIGN PATENT DOCUMENTS

| EP | 0 975 073 | 1/2000 |
| JP | 11-261155 | 9/1999 |

OTHER PUBLICATIONS

Growth and properties of liquid–phase epitaxial $GaAs_{1-x}Sb_x$, R.E. Nahory et al, Journal of Applied Physics, vol. 48, No. 4, Apr. 1977, pp. 1607–1614.

Application of the CALPHAD method to material design, Hiroshi Ohtani et al, Thermochimica Acta 314, 1998 69–77, pp. 127–135.

* cited by examiner

*Primary Examiner*—Don Wong
*Assistant Examiner*—James Menefee
(74) *Attorney, Agent, or Firm*—Oblon, Spivak, McClelland, Maier & Neustadt, P.C.

(57) ABSTRACT

Disclosed are semiconductor laser devices which hardly have degradation when used to generate high power of 200 mW or greater over a long period of time. An exemplary semiconductor laser device comprising a semiconductor substrate, and a layer structure formed on the semiconductor substrate and having an active layer with a quantum well layer formed of a ternary system mixed crystal of a III–V compound semiconductor. The material of the quantum well layer is formed in an equilibrium phase which is thermodynamically stable at both the growth temperature and the operating temperature. The material preferably has a substantially homogeneous disordered microstructure. In a preferred embodiment, the material comprises GaAsSb. The quantum well layer exhibits improved thermodynamic stability, and the device can emit light in the 980 nm band at high power levels for longer periods of time without failure in comparison to conventional InGaAs 980 nm pumping lasers.

32 Claims, 14 Drawing Sheets

107, GaAs Cap layer, 10 nm
106, $Al_{0.3}Ga_{0.7}As$ Clad, 200 nm
105, $GaAs_{0.9}P_{0.1}$ Barrier, 10 nm
104, $GaAs_xSb_{1-x}$ Well Layer, 7nm
103, $GaAs_{0.9}P_{0.1}$ Barrier, 10 nm
102, $Al_{0.3}Ga_{0.7}As$ Clad, 200 nm
101, n-GaAs Substrate

- 20 Package
- 21 Peltier module
- 22 Base material
- 23 Chip carrier
- B (B') Laser Diode
- 24 Optical fiber
- 24a Fiber Bragg grating
- 25 Fiber fixing member
- 26 Sleeve
- 27 Photo diode

SEMICONDUCTOR LASER DEVICE

CROSS REFERENCE TO RELATED APPLICATION

This application is based on Japanese patent application 2001-251,364, filed on Aug. 22, 2001, the whole contents of which are incorporated herein by reference.

FIELD OF THE INVENTION

The present invention relates to a semiconductor laser device, and, more particularly, to a facet emitting type semiconductor laser device having a Fabry-Perot cavity structure.

BACKGROUND OF THE INVENTION

Today, most of the laser devices which emit at a wavelength band of 980 nm are made of a GaAs-based compound semiconductor material. The following describes a typical example A of such laser devices referring to FIG. 1.

This laser device A is of a ridge optical waveguide having a Fabry-Perot cavity structure. The laser device A has the following layer structure.

A lower cladding layer 2 of, for example, n-$Al_{0.3}Ga_{0.7}As$ is laminated on a substrate 1 of n-GaAs, followed by a lower SCH layer 3a of, for example, non-doped $Al_{0.2}Ga_{0.8}As$.

A barrier layer 4a of non-doped $GaAs_{0.9}P_{0.1}$ and a well layer 4b of non-doped InGaAs, to be discussed later, are alternately laminated on the lower SCH layer 3a, thereby forming an active layer 4 which has a quantum well structure having two wells.

An upper SCH layer 3b of, for example, $Al_{0.2}Ga_{0.8}As$ is laminated on the barrier layer 4a, the topmost layer of the active layer 4. An upper cladding layer 5 of, for example, p-$Al_{0.3}Ga_{0.7}As$ and a cap layer 6 of, for example, $p^+$-GaAs are laminated in that order on the SCH layer 3b.

The top surface of the layer structure, excluding the top surface of the cap layer 6, is coated with a protective film 7 of, for example, silicon nitride (SiN). A p-type electrode 8 is formed in ohmic contact with the top surface of the cap layer 6 and an n-type electrode 9 is formed at the back of the substrate 1.

In this laser device A, the well layer 4b generally contains InGaAs whose InAs mole fraction is 0.15 to 0.2, and is so formed to have a distortion amount (compressive strain) of approximately 1% to 1.4%, to realize high-power lasers emitting at a wavelength band of 980 nm.

These devices have been shown to perform reliably for tens of thousands of hours at relatively high output powers of 200 mW and above before the devices degrade or undergo catastrophic optical failure (ie., irreversible failure). Nonetheless, there is a growing demand for laser devices which can operate at these power levels and above for hundreds of thousands of hours without degradation or catastrophic failure. The present invention is directed to providing laser devices and methods for their construction which can meet this growing demand.

OBJECT AND SUMMARY OF THE INVENTION

In making their invention, the inventors have discovered that the InGaAs quantum well layer of the prior art high-power devices develops a precipitation of Indium (In) rich phase of InGaAs. This is a new view-point of the mechanism of degradation of the high-power devices that use InGaAs material in the active layer. The precipitate in the quantum well layer is located near the front facet or inner cavity of the stripe. The precipitate is not present after initial fabrication of the device, but appears to gradually develop after thousands of hours of operation at high output power. The precipitate creates a localized large strain in the quantum well region due to a large mismatch.

During the period when the precipitate grows without dislocation loops occurring, the operating status of the laser diode does not degrade. If the strain around the precipitate exceeds a certain amount, dislocation loops appear around the precipitate, and then the laser diode degrades quickly and catastrophic failure occurs. Thus, the catastrophic failure of this mode (long-duration degradation mode: LDDM) suddenly happens after a long period of time where no degradation is observed. The LDDM is difficult to remove by the usual screening procedure, for example, burn-in testing. The failure caused by the LDDM limits the lifetime of laser diodes (LDs) which use InGaAs quantum wells.

The inventors believe that the precipitation process is accelerated by an underlying thermodynamic instability in the InGaAs material. It is shown in the following description that the precipitate should be attributed to the In-rich phase of InGaAs. Also, the nucleation-process of the precipitation is shown to be heterogeneous type by analysis of the phase diagram of InGaAs.

After studying the mechanism for the formation of the precipitate in the InGaAs quantum well layer, the inventors developed and verified the present invention, which is a significant departure from the 980-nm InGaAs pumping laser art.

In one aspect of the present invention, an exemplary semiconductor laser device according to the present invention comprises a semiconductor substrate, and a layer disposed over the substrate which comprises $GaAs_{1-x}Sb_x$ in a mixed-crystal phase of As-rich GaAsSb and Sb-rich GaAsSb. The microstructure (i.e., microscopic-structure) of GaAsSb is affected by the conditions of epitaxial growth. The substantial homogeneous microstructure is suitable for the quantum well of pumping laser due to high efficiency of emission. The construction and the growth conditions, which make the realization of the GaAsSb with homogeneous microstructure, are shown.

The atomic fraction of antimony (Sb) in this aspect of the present invention is preferably in the range of 0.08 to less than 0.20 (0.08<=X<0.20). That is to say, the percentage of antimony atoms with respect to total column-V atoms is greater than or equal to 8% and less than 20%. ("Column" in this context means the column of the periodic table of elements.)

In another aspect of the present invention, an exemplary method of forming the above layer comprises the deposition of materials of gallium, arsenic, and antimony by metal-organic chemical vapor deposition (MOCVD) at a rate equal to or greater than 0.5 nm per second, with the temperature of the deposition surface being equal to or greater than 600° C. Preferably, the relative amount of the precursor gas for antimony is selected to limit the percentage of antimony atoms in the layer to less than 20% of the total column-V atoms in the layer.

In preferred embodiments of this aspect of the present invention, the layer is a quantum well layer, and has optical confinement layers located (i.e., disposed) on either side of it. Cladding layers are preferably located on either side of these layers. The quantum well layer preferably has a thickness which is less than about 20 nm, and more preferably less than or equal to about 12 nm. The bandgap of each optical confinement layer is preferably larger than the bandgap of the quantum well layer, and the index of refraction of each optical confinement layer is preferably larger than the index of refraction of the adjacent cladding layer.

In a still further preferred exemplary embodiments of these aspects of the present invention, relatively thin barrier layers are located (i.e., disposed) on either side of the quantum well layer, and two optical confinement layers are located on either side of this group of layers. The inventors have discovered that the specific barrier layers substantially reduce the threshold current required for lasing, and improve the temperature dependence (behavior) of the threshold current. In preferred implementations, the barrier layers are approximately 2 nm to 10 nm in thickness, and comprise GaAs or GaAsP while the optical confinement layer comprises $Al_{0.2}Ga_{0.8}As$.

The inventors have found the GaAsSb material of the present invention to be more thermodynamically stable than the InGaAs material used in 980-nm band layers, and to exhibit less degradation over time.

In yet another aspect of the present invention, an exemplary semiconductor laser device according to the present invention comprises a semiconductor substrate and a layer structure formed on the semiconductor substrate. The layer structure comprises one or more well layers formed of one or more compound semiconductors, each of which belongs to a ternary III–V compound semiconductor system. Each such system has a plurality of equilibrium phases as a function of temperature and composition of its constituent elements. Each well layer is formed in a first one of the equilibrium phases, with the first one of the equilibrium phases being a mixed-crystal solid and preferably being thermodynamically stable at room temperature, and more importantly being thermodynamically stable during the operation of the device leading to a junction temperature of 100° C. to 200° C. In a preferred implementation of this aspect, each well layer is formed with a substantially homogeneous disordered microstructure.

In preferred embodiments of this aspect of the present invention, the well layer preferably has a thickness which is less than about 20 nm, and more preferably less than or equal to about 12 nm.

In still another aspect of the present invention, an exemplary method according to the present invention comprises forming one or more layers of one or more compound semiconductors over a top surface of substrate which has one or more semiconductor layers previously formed thereon, with the one or more layers being formed at growth temperatures which are at or above 400° C. The compound semiconductor of each such layer belongs to a ternary III–V compound semiconductor system, which has a plurality of equilibrium phases as a function of temperature and constituent composition. Each such layer is formed in a first one of the equilibrium phases with the first one of the equilibrium phases being a mixed-crystal solid and preferably being thermodynamically stable at room temperature, and more importantly being thermodynamically stable during the operation of the device leading to a junction temperature of 100 to 200° C. In a preferred implementation of this aspect, each such layer is formed with a substantially homogeneous disordered microstructure.

In preferred embodiments of this aspect of the present invention, the layer preferably has a thickness which is less than about 20 nm, and more preferably less than or equal to about 12 nm.

Accordingly, it is an objective of the present invention to provide an active semiconductor layer which has good thermodynamic stability.

It is a further objective of the present invention to enable the construction of semiconductor laser devices which emit light at high output power of 200 mW or more in the 980-nm band and in single transverse mode, with higher reliability relative to conventional InGaAs based laser devices.

It is a still further objective of the present invention to enable the construction of such devices which can operate for longer periods of time without catastrophic optical failure as compared to conventional InGaAs based laser devices.

These and the other objectives of the present invention will be made more apparent from the following description.

DETAILED DESCRIPTION

Figure 1:
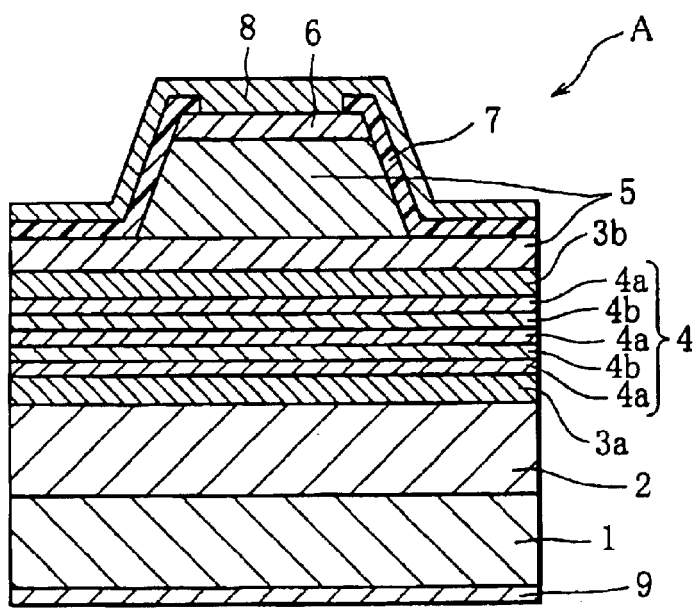
FIG. 1 is a cross-sectional view showing the layer structure of an example A (InGaAs-LD for EDFA) of a conventional semiconductor laser device.

There is an increasing demand that the laser devices which emit at a wavelength band of 980 nm for EDFAs (Erbium-doped Fiber Amplifiers) should be driven to generate high optical power. In the applications where a laser device A shown in FIG. 1, for example, is driven to generate high power of 200 mW or greater over a long period of time to realize coupling to a single mode fiber (SMF), higher optical density is created.

Additionally, laser devices which emit at a wavelength band of 1050 nm are developed in order to apply for TDFAs (Thulium-doped Fiber Amplifiers). TDFAs make the available bandwidth for dense wavelength-division multiplexing (DWDM) to expand to the short wave region of 1460–1480 nm (S-band). The structure of these 1050 nm-LDs also contains InGaAs quantum wells, same as the device A.

In the development of these LDs, the progress for the expansion of output power is often limited by the degradation in the higher power operations. Generally, the screening of burn-in tests is applied to remove the devices that are susceptible to degradation after fabrication. In the burn-in test, the LDs are operated for about 100 hours at the accelerated conditions, for example at a higher temperature of 70° C. and larger output-power than used in normal operation. The well-known degradations caused by poor passivation of the facet and accumulation of the oxygen impurity in AlGaAs, etc., are easily removed by this screening, because these degradations leave clear traces during this test.

Next, the successful devices are examined for their long duration performance while they are operated at the accelerated condition, and the lifetimes are estimated by the rate of failure. In this test, catastrophic failure sometimes occurs. The inventors refer to this type of degradation as the "long-duration degradation mode" (LDDM). The lifetime of LDs operating at over 200 mW is limited by the LDDM. In the active layer of an LD with the LDDM, a recrystalized region caused by rapid cooling from the molten state is observed. These regions have the characteristics of a typical catastrophic optical damage (COD). As a result, degradation, such as cessation of laser oscillation, is likely to occur. That is, the drive reliability of the laser device A is low at the time when it is driven to generate high power of 200 mW or greater.

Some of the Fabry-Perot type semiconductor laser devices whose active layers are formed of InGaAs have their facet structures modified to generate high power of about 300 mW. However, the active layer of such a laser device is degraded when it is driven to generate high power over a long period of time, resulting in a unsatisfactory drive reliability over long usage.

The Degradation Process of Conventional Laser Diodes that use InGaAs-Quantum Wells In the following description, the mechanism of the LDDM is revealed, and it is shown how the precipitates caused by thermodynamic instability of InGaAs can be removed.

Figure 2:
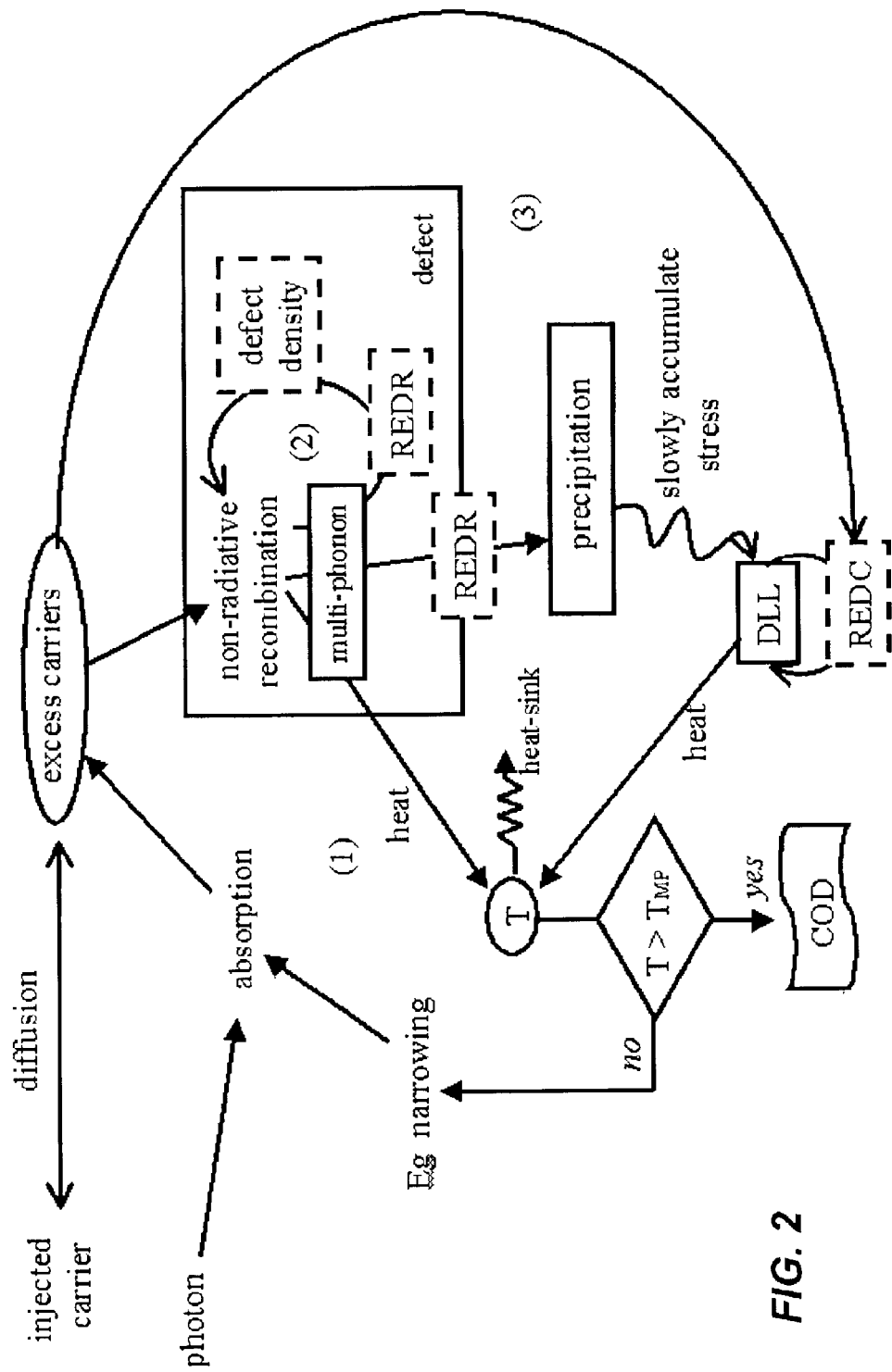
FIG. 2 is a explanatory diagram for the COD mechanism according to the present invention.

FIG. 2 shows an explanatory diagram for the COD mechanism. Excess carriers exist in the quantum well due to the injection of current when an LD is operated. The defects (for example, surface/interface states, dislocation or point-defects) in the crystal act as the centers for non-radiative recombination (NRR) of excess carriers. The recombined carriers generate multi-phonons with an energy that is related to the bandgap energy (Eg) and the amount of recombined carriers. First, in the loop (1), the temperature (T) at the region around defects increases by the heat due to the multi-phonons. The usual temperature rise caused by the operation of the LD adds to the increased temperature caused by the recombination process. The temperature increase from both of these processes causes a narrowing of the bandgap energy of the quantum well around the defects, which increases its absorption of optical energy. The localized increase in absorption further increases the excess carriers around the defects, thereby forming a reinforcing (positive) feedback loop. In this loop, if the temperature crosses over the melting point ($T_{MP}$) of the active layer, the COD phenomenon occurs. This failure is found at the initial operation of LDs. The usual increase of temperature saturates at a point below $T_{MP}$ because of limitation of the density of defects. (In other words, the increase in temperature is usually limited by the defect density so that it saturates at a point below $T_{MP}$.)

Next, in the loop (2), the multi-phonons produced by the NRR-process enhance the increase of defects. This reaction is well known as the recombination-enhanced defect reaction (REDR) or the recombination-enhanced dislocation climb (REDC). If the passivation of the facet is insufficient, or, if an effective dislocation exists around the active layer, the saturated temperature gradually increases due to the increase of defects. Then, if T crosses over $T_{MP}$, COD occurs. This type of degradation is easy to screen using the burn-in test, in which the LDs operate at higher temperature and optical power than in usual operation, for example, 60° C. and 300 mW rather than 25° C. and 200 mW.

Third, in the loop (3), it is shown the COD of LDDM. In this loop (3), the multi-phonons enhance the formation of the precipitation in the active layer, and specifically the quantum well layer. The precipitation is found in the active layer around the defects as the region of In-rich composition. The location of such precipitation around defects has been observed by Chu, et al., Applied Physics Letters, vol.78, No.21, p 3166. May 21, 2001.

Because the precipitation does not act as a center of NRR, the operation of LD is not affected by the precipitation during the initial creation of the precipitation and the first stage of its growth. But strain accumulates around the precipitation in proportion to the growth because of the large lattice mismatch between the In-rich precipitate and the GaAs substrate. If the strain around the precipitation exceeds a certain value, dislocation loops (DLLs) appear around the precipitation. Since the DLLs act as centers of NRR, the DLLs grow quickly due to the REDC process, and a new positive feedback loop (3) starts to act. At last, the LD degrades quickly and COD failure happens. The latent time during the growth of the precipitation is sometimes over thousands of hours under accelerated operation.

Referring to FIG. 2, we point out various methods of suppressing COD. First, disordering of the quantum well near the facet region is effective in reducing the absorption of the emitted light. Second, a passivation including the growth of an InGaP layer on the facet reduces the surface states at the facet. Third, reducing the optical density of emitted light through the construction of the laser structure also makes good results. But, according to these methods, it is difficult to remove the precipitation which appears anywhere including the defects in the LD chips, because it is impossible to remove the defects perfectly. It is more effective to minimize or remove the precipitation thoroughly from the viewpoint of thermodynamic instability in the material that is used for the quantum well layers.

Process of Precipitation in InGaAs-Quantum Wells of Conventional Laser Diodes

The mechanism for the appearance of the precipitation is revealed.

Through their various investigations and studies, the inventors have developed the belief that the above destructive processes are aided by an underlying thermodynamic instability in the crystal structure of the conventionally-grown InGaAs. A material composed of a mixture of elements, such as a ternary III–V compound semiconductor material, can be characterized by a material system of the constituent elements of the material. The material system has a plurality of equilibrium phases in which the material can exist (e.g., at least a liquid phase and at least one solid phase). The thermodynamically-stable extent of each phase of the system depends upon temperature, composition of elements, and sometimes external stresses, if present. The extents of the phases are typically plotted on a phase diagram, which shows composition on one axis, the temperature on another axis, and identifies the extent of each equilibrium phase in the area defined by these axes. If an external stress is present, the phase diagram is usually plotted for a particular stress value or stress factor (such as the substrate type when forming a thin material on a substrate of different material). It is possible for a material to be formed in a first equilibrium phase at a first temperature, and to then be quickly cooled to a second temperature covered by second equilibrium phase, but with the material still remaining in the first phase. In this case, the cooled material is thermodynamically unstable since the second temperature favors the second equilibrium phase. On the other hand, a thermodynamically stable material is in the phase that is the equilibrium phase for the material's composition and temperature.

Figure 3:
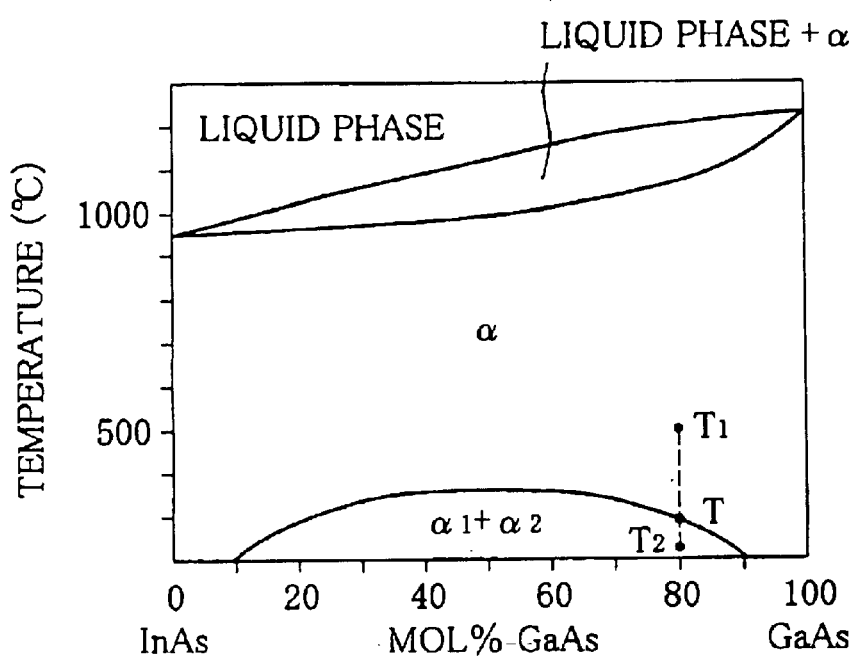
FIG. 3 is a pseudo binary system phase diagram of InAs and GaAs exemplifying aspects according to the present invention.

FIG. 3 shows what is presently believed to be the most accurate compositional phase diagram for the InGaAs ternary system, as placed under stress by an underlying GaAs substrate. It is known that the strain between the ternary system and the substrate modifies the phase diagram. For example, the shape of the phase diagram of the InGaAs ternary system, as placed under stress by an underlying InP substrate, changes drastically near the lattice matched (to the InP substrate) composition of $In_{0.47}Ga_{0.53}As$. However, being a pseudo binary system, with the substrate material GaAs itself being a constituent, the phase diagram of InAs—GaAs on a GaAs substrate does not include such a drastic variation. The InGaAs ternary system is presently believed to be a "pseudo binary" mixed crystal system where the components InAs and GaAs substantially behave like respective elements of a binary alloy. The horizontal axis of the diagram presents the composition variation in terms of GaAs percentage (pure InAs on the left, pure GaAs on the right). The vertical axis presents the thermal equilibrium temperature of the material. The stressed InGaAs material, while under thermal equilibrium conditions, may exist in four different phases (forms), depending upon the temperature and composition. These phases are: 1) liquid, 2) the $\alpha$ solid, 3) a mixture of the liquid and $\alpha$ solid phases, and 4) the mixed $\alpha_1+\alpha_2$ solid phase. Under thermal equilibrium conditions, the material exists in one of the four phases, unless the material has a temperature and composition which places it on the border between two phases, in which case the material simultaneously exists in those two phases. The $\alpha$ solid phase has an even dispersion of InAs and GaAs crystals in the material, whereas the $\alpha_1+\alpha_2$ solid phase has mixed regions of two different compositions, InAs-rich and GaAs-rich.

Conventional InGaAs quantum well layers are grown at temperatures above 600° C., which favors the formation of the $\alpha$ solid phase during the growth process for all compositions values. After the growth of the InGaAs well layer and the succeeding layers above it, the temperature of the layer is reduced at a rate of 10° C. to 40° C. per minute, and the material transits from the $\alpha$ solid phase region to the $\alpha_1+\alpha_2$ solid phase region. The rate of temperature decrease is too fast for the material to separate into the $\alpha_1$ phase and $\alpha_2$ phase, and the InGaAs quantum well is placed in a supercooled solid phase $\alpha$, which is thermodynamically unstable. The laser is subsequently operated at temperatures that are well within the $\alpha_1+\alpha_2$ solid phase region. The inventors currently believe that the unstable supercooled state of the InGaAs quantum well layer is an underlying aid to the destructive processes described above in FIG. 2. It appears to the inventors that phase separation from the unstable supercooled state to the $\alpha_1$ phase and $\alpha_2$ phase, which are more stable, progresses and, from the microscopic point of view, the composition of the well layer is changed. The designs of the InGaAs layer for 980 nm LDs usually have an InAs mole fraction of 0.15, leading to the precipitation of the In-rich $\alpha_1$ phase from the supercooled solid phase $\alpha$.

Next, the initial stage of occurrence of the precipitate is examined. Initially the supercooled $\alpha$ state has no nucleation centers for the formation of both the $\alpha_1$ and $\alpha_2$ phases. On the above condition, it is known that the precipitation starts after heterogeneous nucleation, in which the nucleation occurs at a special region in the crystal, for example, the region containing defects or interfaces, and concentrates at that particular place. This phenomenon corresponds to the observation of the degraded InGaAs-LDs.

The inventors believe that the following approaches are effective for suppressing this phenomenon.

(1) The temperatures for crystal growth, LD fabrication process and laser operation are selected in such a way that the crystal used in the quantum well layer remains in the same single phase α, in all these cases.

(2) The temperatures for crystal growth, LD fabrication process and laser operation are selected in such a way that the crystal used in the quantum well layer remains in the mixed crystal phase $\alpha_1+\alpha_2$, in all these cases.

InGaAs Ternary System

If an InGaAs quantum well has to be used on a GaAs substrate, the first approach is not possible, (1), because the devices have to perform near room temperature. However, it is possible to reduce the growth temperature enabling the adoption of the second approach. Specifically, the inventors have thought of a method of growing an InGaAs quantum well layer at a temperature below about 400° C. so that the layer is grown in the same phase in which it is operated, the phase $\alpha_1+\alpha_2$. But if this method is applied, then the temperatures for all the other processes are limited to lower than this temperature. However, the optimum temperature for the growth of a p-clad layer of AlGaAs, which is grown above the InGaAs layer, is over 600° C., since AlGaAs grown at low temperature contains large amounts of impurities. If AlGaAs grown at low temperature is used for a p-clad layer of a pumping laser, then the degradation processes easily occur. Thus, it seemed that another material system has to be used if we want to utilize the second approach.

Other Material Systems

Figure 4A:
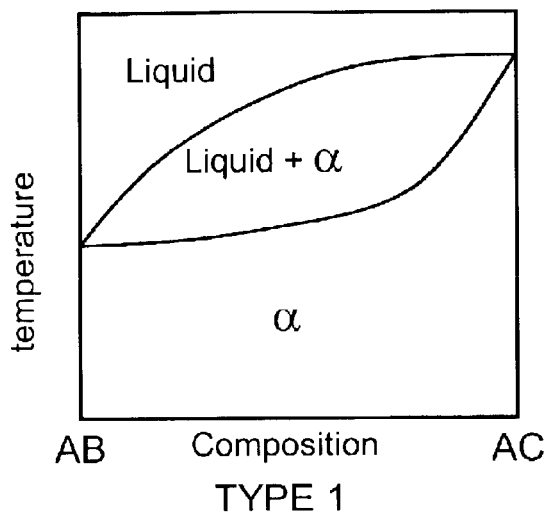
FIGS. 4A–4C show three general phase diagrams of three types of pseudo-binary mixed crystal systems (AB, AC) identified by the present invention.
Figure 4B:
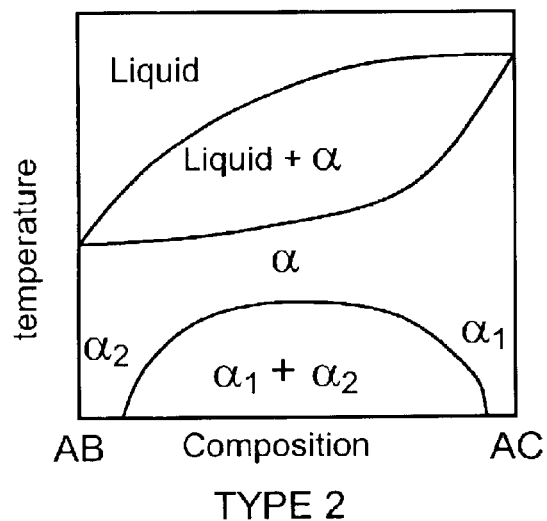
Figure 4C:
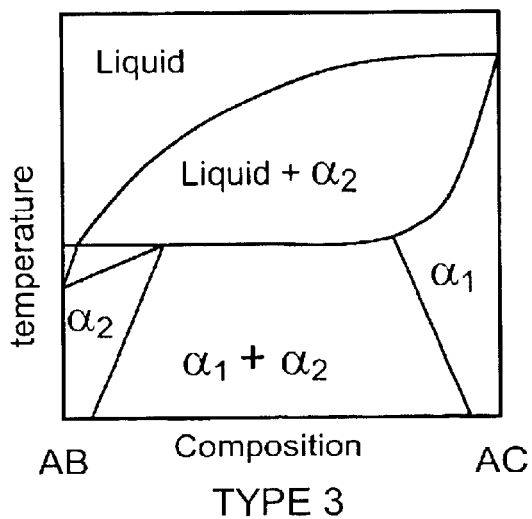

In view of our findings, we examine various compound semiconductor systems for compound materials which have the same equilibrium phase at a growth temperature of 400° C. or above, and more preferably 500° C. or above, and an operation temperature around room temperature or moderately above, corresponding to a junction temperature between approximately 100° C. to approximately 200° C. We have looked at ternary crystals consisting of Al, Ga or In as column-III atoms and Pg As or Sb as column-V atoms. The compositional phase diagrams for these pseudo binary systems can be classified into three general types, which are shown in FIGS. 4A to 4C. We can consider basic things from these phase diagrams, but the strain effects should be taken into account because the strain modifies the phase diagrams. Such strain effects include, for example, the strain that is generated in the layer due to a difference in lattice constants between the material of the layer and the material of the substrate.

The TYPE 1 (FIG. 4A) includes no mixed crystal phases. The TYPE 2 (FIG. 4B) is the same as InGaAs. The TYPE 3 (FIG. 4C) includes mainly the units of mixed crystal phases.

TABLE I

| TYPE 1 | TYPE 2 | TYPE 3 |
|---|---|---|
| AlAsP | AlAsSb | AlPSb |
| GaAsP | InAsSb | GaPSb |
| InAsP | AlGaSb | GaAsSb |
| AlGaP | AlInP | InPSb |
| AlGaAs | AlInAs | |
| AlInSb | InGaP | |
| | InGaSb | |
| | InGaAs | |

For constructing 980-nm lasers, one needs to select from materials that can lase in the 980-nm band. Also, the lattice constant of these materials should be within the limit of allowable mismatch from that of a substrate. In general, GaAs substrates are more suitable for the devices of 980 nm band, because of the low absorption of 980 nm light by GaAs and because of the ease of formation of AlGaAs cladding layers on GaAs substrates. However, other types of substrates may also be used, particularly if non-absorbing cladding layers and buffer layers are used.

Among the materials belonging to TYPE 1, AlInSb and InAsP satisfy the emission of 980 nm. But they are not best suitable for GaAs based LD's, since the lattice mismatch with GaAs substrate exceeds over 3 or 4%. Other materials of TYPE 1 are not available for use on GaAs substrates.

Among the materials belonging to TYPE 2, the most suitable material for constructing 980 nm on GaAs substrates is InGaAs. As indicated above, this material has difficulties associated with it.

Among the materials belonging to TYPE 3, the inventors have found that GaAsSb is very well suited for constructing 980 nm lasers on GaAs substrates. This material is described below in greater detail.

If ternary substrates are used in place of the binary substrates, then some of the TYPE 2 materials become useful for constructing 980 nm lasers. (Additional TYPE 1 and 3 materials may also become available.) For example, the system of an InGaAs quantum well (TYPE 2) grown on a lattice matched InGaAs substrate can be used, as described in greater detail below. At the present time, however, ternary substrates are considerably more expensive than binary substrates, which poses a significant barrier to their large-scale use. In the future, it is possible that the costs of ternary substrates will decrease to remove this barrier.

GaAsSb Material System

GaAsSb is one of the materials of TYPE 3. Using GaAsSb for the quantum well layer, the emission near 980 nm is available and it can be grown on a GaAs substrate with pseudo-morphic lattice matching.

Figure 5:
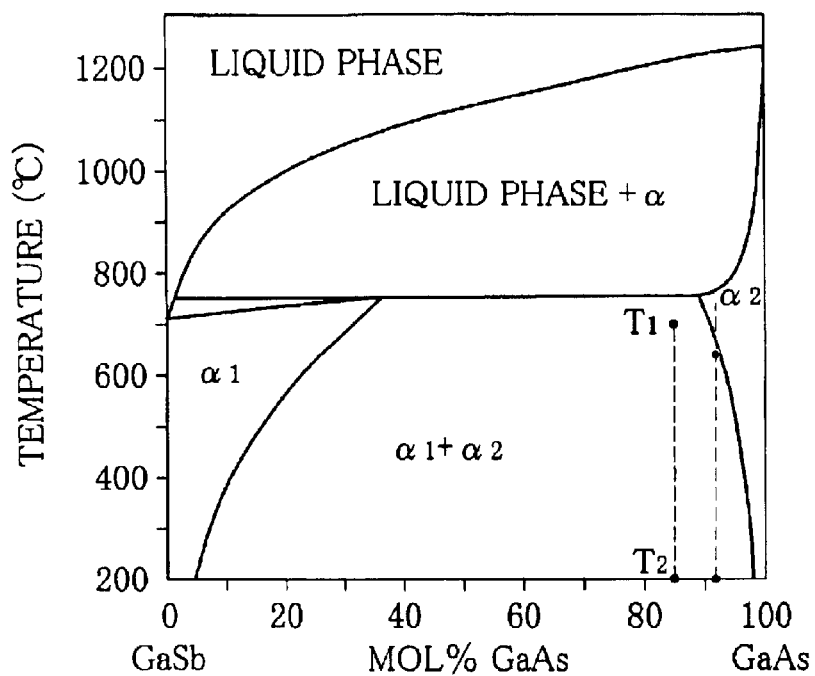
FIG. 5 is a pseudo binary system phase diagram of GaSb and GaAs exemplifying aspects of the present invention.

The compositional phase diagram for the pseudo binary system between GaSb and GaAs is shown in FIG. 5. As can be seen, it comprises a liquid phase (L), a mixed liquid and solid phase (L+α), a first solid phase ($\alpha_1$), a second solid phase ($\alpha_2$), and a mixed crystal of the first and second solid phases ($\alpha_1+\alpha_2$). The region of the composition of $0.08<=x<=0.65$ where "x" is the GaSb mole fraction in GaAsSb, i.e. $GaAs_{1-x}Sb_x$ exists in the same mixed crystal $\alpha_1+\alpha_2$ phase under about 660° C. to 700° C. It is thermodynamically stable so that it causes no precipitation from the heterogeneous nucleation. For composition values with x between ~0.03 and ~0.11, and in the temperature range from 200° C. to 800° C., the material can be thermodynamically stable in either of the solid states ($\alpha_1+\alpha_2$) and $\alpha_2$, and the (liquid+α) phase. (The temperature 200° C. represents a typical maximum junction temperature, and 800° C. represent the typical maximum temperature used in III–V epitaxial growth processes.) Thus, in this composition range, the growth temperature should be kept below the phase-transition line between the ($\alpha_1+\alpha_2$) and $\alpha_2$ phases. A composition line is drawn on FIG. 5 at x=~0.08 to illustrate this point.

The crystal growth for this type of material should be well controlled, because generally the effect of phase separation in the mixed crystal system prevents the formation of homogeneous crystals.

Another problem is the ordering of the crystal. Often Type 3 materials have the metastable states of the ordering of crystal phases, whose structures are like the CuPt or the CuAu of a binary alloy system. The reference by Fink, et al. Applied Physics Letters, vol. 79, No. 15, p 2384–2386. Oct. 8, 2001 (published after Applicants' priority filing date) indicates that GaAsSb can have order/disorder modulation in systems that are formed on InP substrates. Because no large strain is produced by precipitating of this ordering phase in the crystal, it is believed by the inventors that the LDDM phenomenon does not occur in these devices. But an inhomogeneous system including order/disorder phases is expected to degrade the optical quality of the laser diodes due to the existence of the point defects at the interface between the two phases. These point defects act as the centers of NRR, which cause the lowering of the laser performance, i.e. large threshold current, small material gain. And it also has a further possibility of gradual degradation, such as by a mechanism different from LDDM.

The inventors have found that it is better to obtain the homogeneous structure material, in which no contrast patterns owing to the order/disorder structures are observed by TEM. In general, to get the homogeneity, the inventors have discovered that it is effective to select the growth conditions of higher temperature and higher growth rate.

Further Embodiments of Other Materials

The materials of nitride which include Nitrogen (N) as a column-V atom will also be examined. GaAsN is a promising material, which the inventors expect to belong to TYPE 1.

In further embodiments of the present invention, small amounts of nitrogen and indium are added to the quantum well layers, such an GaAsSb quantum well layers, to reduce stress and provide other benefits. The nitrogen atoms are limited to a percentage of 2% or less with respect to total column-V atoms. The indium atoms are limited to a percentage of 2% or less with respect to total column-III atoms. Other column-III and column-V elements may be similarly added (each being limited to 2% or less).

Antimony Content and Thickness of the Quantum Well Layer

Before describing embodiments of the present invention, the inventors describe the antimony contents and thickness of GaAsSb quantum well layers which have peak photoluminescence (PL) wavelengths in the range of 940 to 1100 nm at room temperature (300 K).

To obtain the material properties for the $GaAs_{1-x}Sb_x$ material system, linear interpolation between the parameters of GaAs and GaSb can be used. The one exception is the computation of the bulk band gap energy, where it is better to use the following non-linear interpolation formula:

$$E_g(x)=1.43(1-x)+0.73x-1.2x(1-x)$$

at room temperature, where a large bowing parameter (-1.2 eV) occurs in the band gap energy [P. E. Nahory et al.: J. Appl. Phys. 48, 1607 (1977)]. While this formula is for unstrained bulk material, it is accurate for $GaAs_{1-x}Sb_x$ material layers that have low amounts of strain (such as up to 3% in magnitude). The quantum effect will have a greater effect on effective band gap value than any inaccuracies of the above formula.

When the thickness of the GaAsSb layer becomes comparable to the de Broglie wavelength of an electron or hole, quantum size effects become apparent. In this regime, the wavelength of the photo-luminescence (PL) has blue shifted as compared with that of bulk material.

Figure 6:
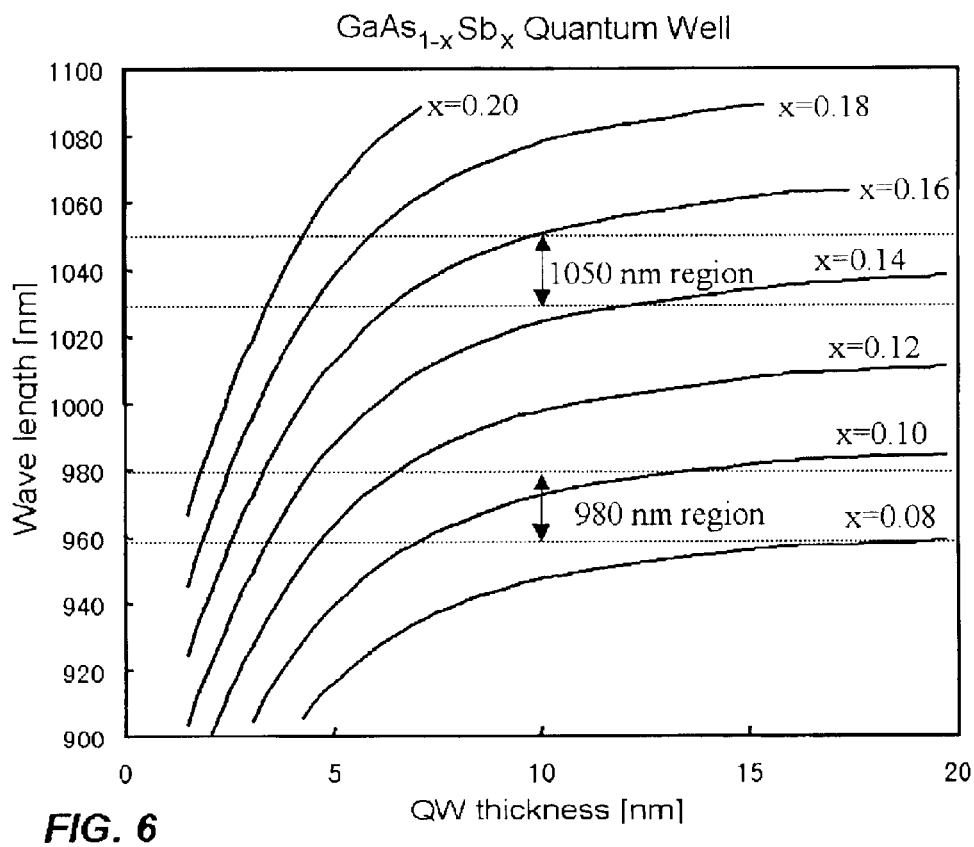
FIG. 6 shows the relationship between the thickness and composition of a GaAsSb quantum well layer and the peak wavelength observed by the photoluminescence (PL) at room temperature according to the present invention.

FIG. 6 shows the calculated relationship between the thickness and composition of the GaAsSb quantum well layer and the peak photo-luminescence (PL) wavelength observed at room temperature. The material of the barrier layer is $GaAs_{0.9}P_{0.1}$ in this calculation. As illustrated in FIG. 6, a wavelength band of 980 and 1050 nm can be realized under the respective antimony contents of x=0.1 and 0.15, with the thickness of quantum well layer of 7 nm. Since the critical layer thickness of $GaAs_{0.8}Sb_{0.2}$ for strain relaxation is about 15 nm, we can grow the GaAsSb quantum well layers stated above without using strain relaxation techniques.

Growth Method and Characterization by Photoluminescence

The inventors have found that the PL intensity of the quantum well structure was closely correlated with the threshold current density required for lasing of the broad area laser.

First, the inventors describe the growth method of the quantum well structure used for the PL characterization. The relationship between the PL intensity and the threshold current density are presented next. Finally, inventors show that high PL intensity is required to get low threshold current.

Figure 7:
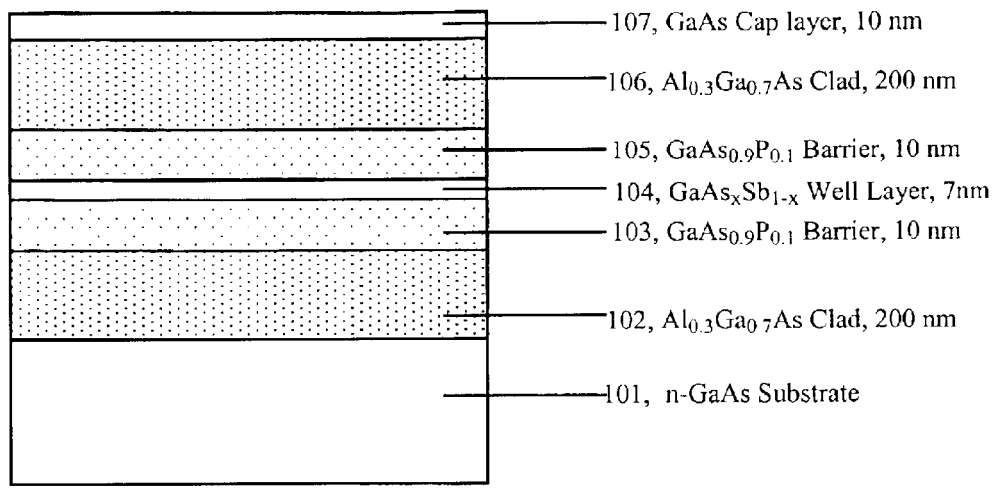
FIG. 7 shows the schematic diagram of the quantum well structure for the PL characterization according to the present invention.

FIG. 7 shows the schematic cross-section of the quantum well structure for the PL characterization. It is to be noticed that this structure is different from that of the laser device. This structure is grown on n-GaAs substrate by conventional MOCVD methods.

The $GaAs_{1-x}Sb_x$ quantum well layer 104 was grown at a temperature range of 520~700° C. and a growth rate range of 0.5~1.2 nm/s using the source gases of tri-ethyl gallium (TEGa), tri-methyl antimony (TMSb), and arsine diluted by hydrogen (10% $AsH_3$+90% $H_2$). The flow rate of TEGa was 85~200 sccm (0.43~1.01 $\mu$mol/sec), the flow rate of TMSb was 50~450 sccm (4.5~41 $\mu$mol/sec), and the flow rate of 10% $AsH_3$+90% $H_2$ was 12~100 sccm (0.89 7.42 $\mu$mol/sec). The total pressure during the growth was 76 Torr. Cladding layers (102 and 106) and barrier layers (103 and 105) were formed by conventional MOCVD methods using conventional source gases.

The PL signal was measured by the commercial scanning micro-photoluminescence mapping system (Waterloo Colo., Ltd., SPM200).

Figure 8:
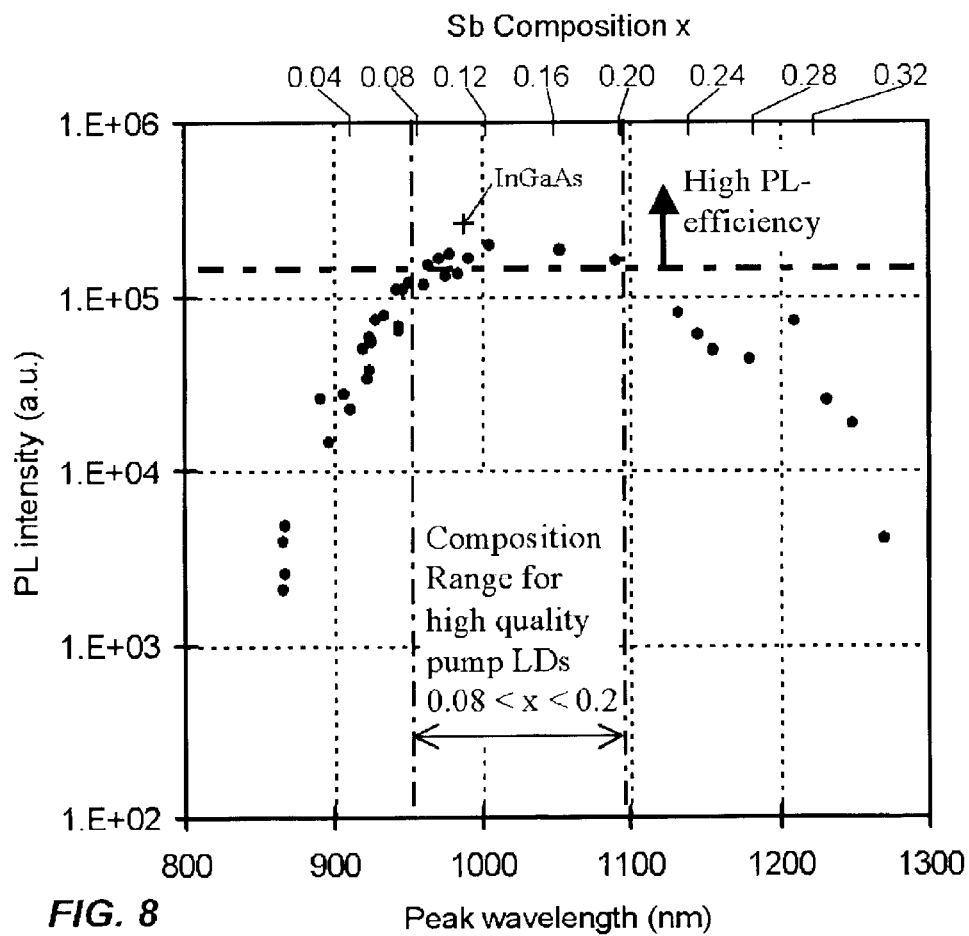
FIG. 8 shows PL intensity plotted as a function of peak wavelength and antimony content for quantum well structures according to the present invention.

FIG. 8 shows PL intensity plotted as a function of peak wavelength and antimony content. The antimony content x is controlled by the flow rate of TMSb, TEGa, and $AsH_3$. The relationship between the antimony content and the PL wavelength is determined from FIG. 6. The result of $In_{0.15}Ga_{0.85}As$ quantum well layer is also plotted for comparison. FIG. 8 shows that the PL intensity has a maximum value around the antimony content of 0.08~0.2 and that the intensity is comparable with that of $In_{0.15}Ga_{0.85}As$ quantum well in this content range. In the low antimony condition (x<0.08), the PL intensity is weak because the electron confinement is not sufficient. The PL intensity is also weak in the high antimony condition (x>0.2) because of the existence of the heterogeneity in the quantum well layer as discussed later. It is impossible to obtain a laser device comparable with InGaAs under these conditions.

Figure 9:
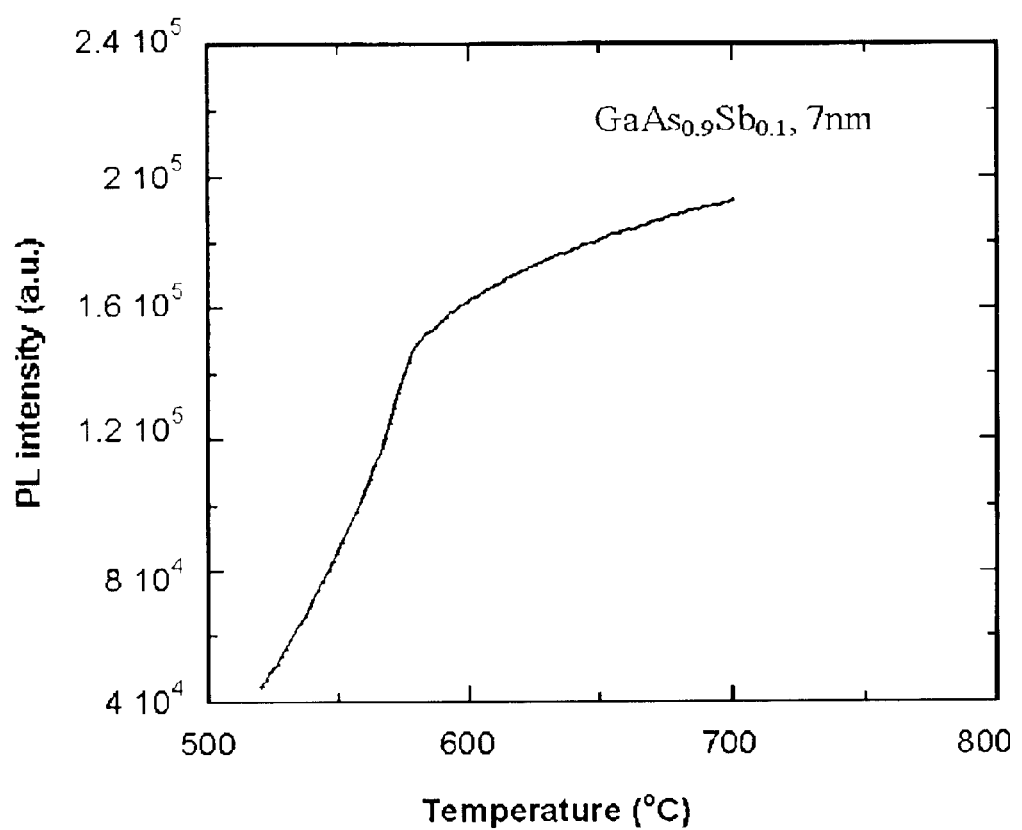
FIG. 9 shows the variation of PL intensity versus different growth temperatures in methods according to the present invention.

Higher growth temperatures increase the PL intensity of the quantum well layer, as illustrated by the data presented in FIG. 9. In these sets of examples, the GaAsSb quantum well layers were grown at a rate of 0.5 nm/s at selected temperatures from 520° C. to 700° C. As can be seen, the PL intensity increases monotonically with increasing growth temperature.

Higher growth rates, such as 1 nm/s and above, also increase the PL intensity of the quantum well layer. For example, the PL intensity of the sample grown at a rate of 1.2 nm/s is 2.7 times higher than that of the sample grown at a rate of 0.5 nm/s. The growth rate is controlled by the flow rate of TEGa.

Figure 10:
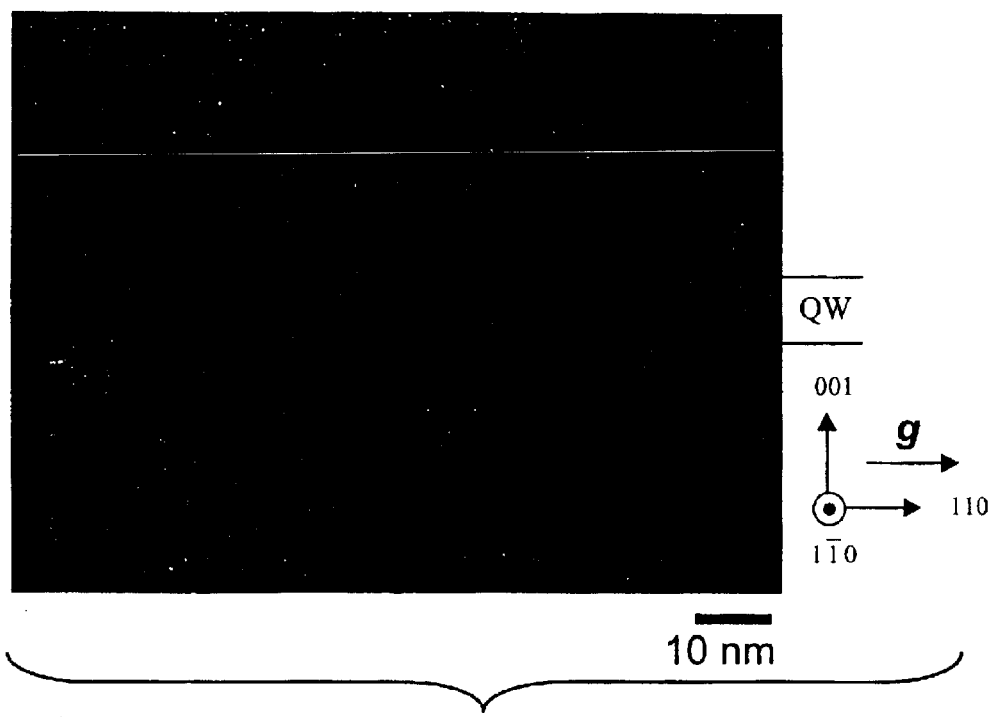
FIG. 10 show a TEM cross-section of a representative quantum well layer according to the present invention as imaged in [1,–1,0] cross section obtained by dark field TEM g=(220)
Figure 11:
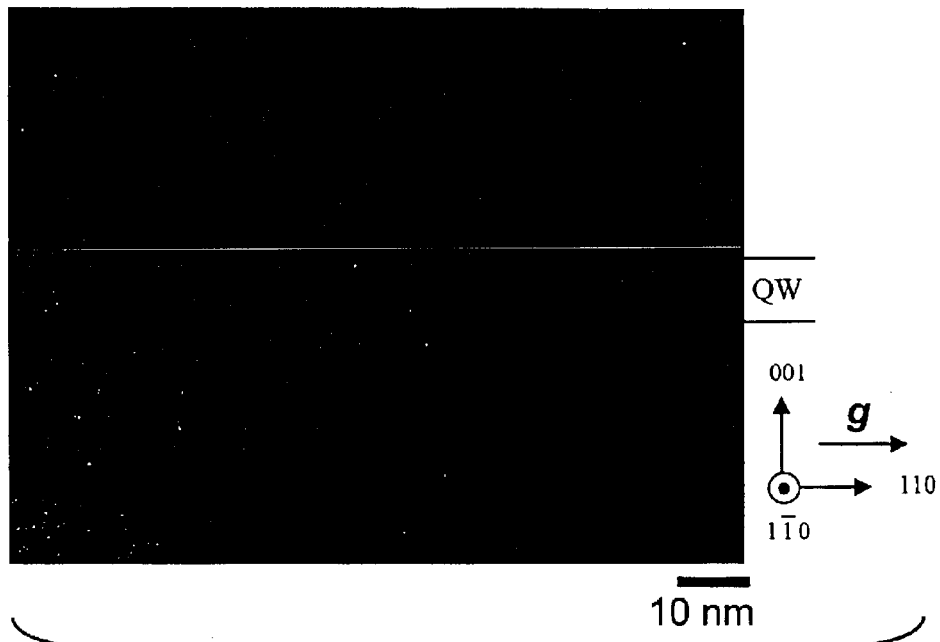
FIG. 11 show a TEM cross-section of a first comparative quantum well layer as imaged in [1,–1,0] cross section obtained by dark field TEM g=(220) to exemplify features of the present invention.
Figure 12:
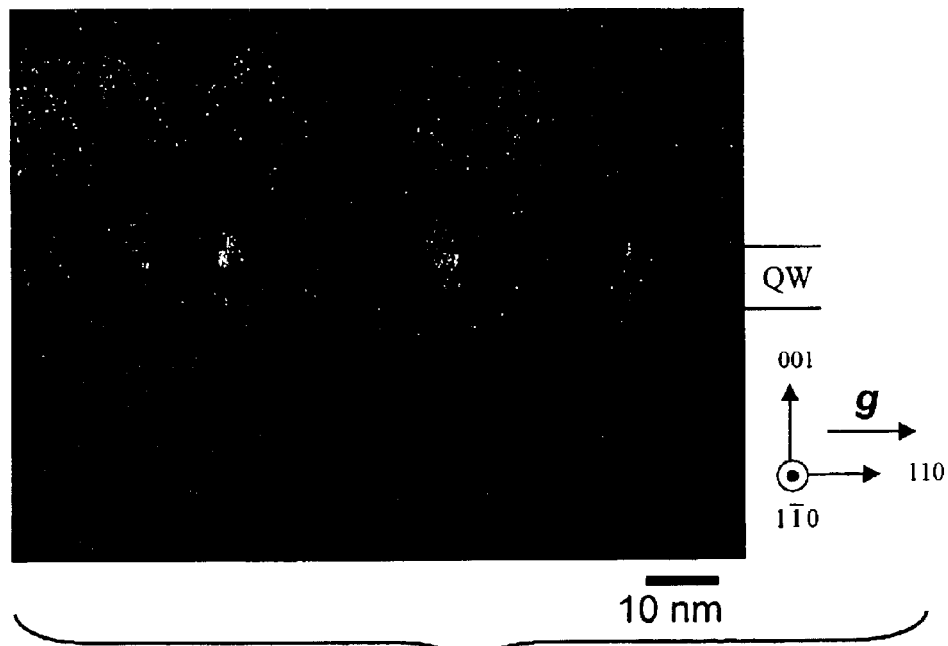
FIG. 12 show a TEM cross-section of a second comparative quantum well layer as imaged in [1,–1,0] cross section obtained by dark field TEM g=(220) to exemplify features of the present invention.
Figure 13:
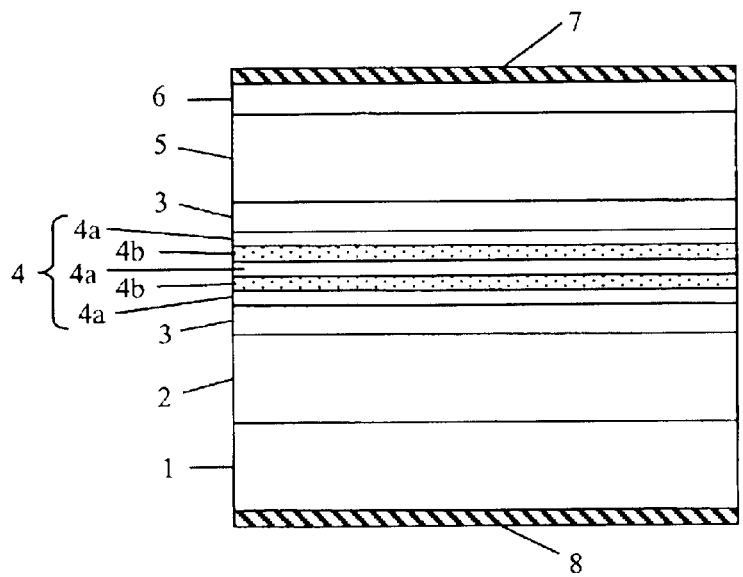
FIG. 13 shows the broad area laser structure used for the characterization of threshold current, the structure incorporating features according to the present invention.

FIGS. 10–12 shows various $GaAs_{1-x}Sb_x$ quantum well layers imaged in [1,−1,0] cross sections obtained by dark field TEM g=(220). The quantum well layers are grown at various temperatures and compositions. Referring to FIG. 13, heterogeneity parallel to the [110] in-plane direction is clearly observed in a $GaAs_{0.62}Sb_{0.38}$ quantum well layer grown at 580° C. Referring to FIG. 12, this heterogeneity is also observed in a $GaAs_{0.9}Sb_{0.1}$ quantum well layer grown at 580° C., but the structure is less pronounced. On the other hand, a $GaAs_{0.9}Sb_{0.1}$ quantum well layer grown at 700° C. is homogeneous, as seen in FIG. 10. These results show that the heterogeneity disappears under the low antimony composition and high growth temperature conditions, which correlate with the conditions under which the PL intensity is high. In other words, a homogeneous GaAsSb quantum well layer is needed to get high PL intensity.

We constructed a number of broad area lasers to characterize the properties of the present invention. The general layer structure of these broad area lasers is shown by FIG. 13. A lower cladding layer 2 of, for example, n-$Al_{0.3}Ga_{0.7}As$ is laminated on a substrate 1 of n-GaAs, and a lower SCH layer 3a of, for example, non-doped $Al_{0.2}Ga_{0.8}As$ is laminated on the cladding layer 2. A barrier layer 4a of non-doped $GaAs_{0.9}P_{0.1}$ and a well layer 4b of $GaAs_{1-x}Sb_x$ are alternately laminated on the lower SCH layer 3a, thereby forming an active layer 4 which has a quantum well structure having two wells. An upper SCH layer 3b of, for example, $Al_{0.2}Ga_{0.8}As$ is laminated on the barrier layer 4a, which is the topmost layer of the active layer 4. An upper cladding layer 5 of, for example, p-$Al_{0.3}Ga_{0.7}As$ and a cap layer 6 of, for example, p$^+$-GaAs are laminated in order on the SCH layer 3b. A p-type electrode 7 is formed in ohmic contact with the top surface of the cap layer 6 and an n-type electrode 8 is formed at the back of the substrate 1. Then, the entire structure was cleaved to a cavity length of 600 μm and width of 250 μm. The growth condition of the GaAsSb quantum well layer is the same as that of the PL characterization samples.

Figure 14:
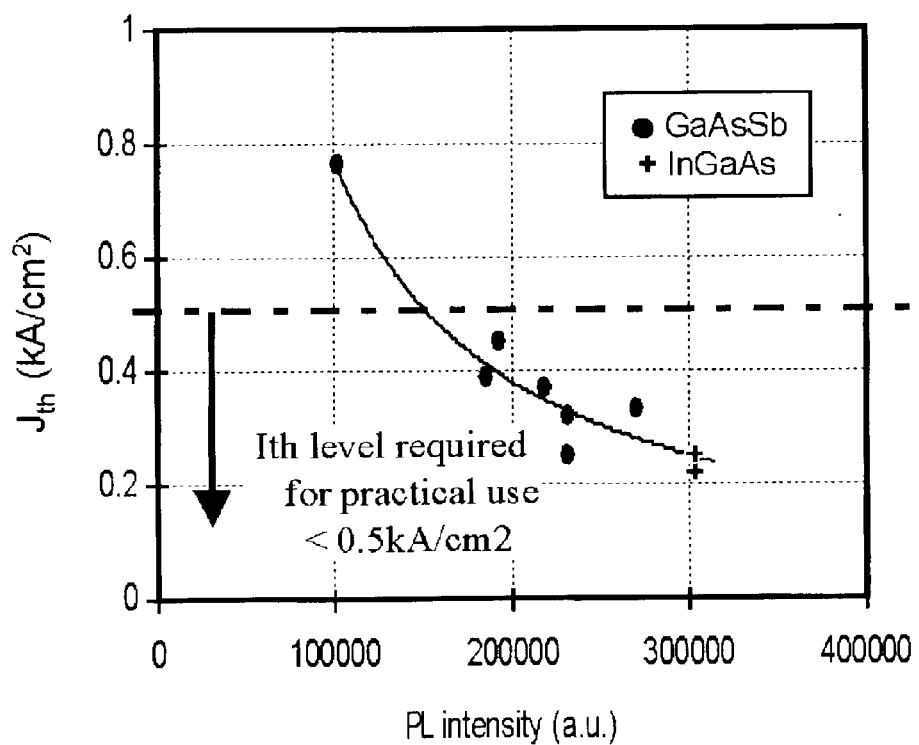
FIG. 14 shows a relationship between the photoluminescence (PL) intensity and the threshold current density of the broad area lasers according to exemplary embodiments of the present invention.

The relationship between the PL intensity and the threshold current density of the broad area laser is shown in FIG. 14. Results of the $In_{0.15}Ga_{0.85}As$ quantum well layer are also plotted for comparison. As can be seen, the threshold current density decreases monotonically with increasing PL intensity. We can estimate the threshold current density of the broad area laser from the PL intensity by using the above relationship. Low threshold current density comparable with the InGaAs quantum well layer is obtained when the PL intensity is higher than 220,000 units. The inventors have found that the presence of the following three conditions during layer growth enables one to obtain a high PL intensity of 220,000 units or more:

(1) Antimony content is equal to or greater than 0.08 and less than 0.2. (That is to say, the percentage of antimony atoms with respect to total column-V atoms is greater than or equal to 8% and less than 20%.)

(2) Growth temperature of GaAsSb layer is equal to or higher than 600° C.

(3) Growth rate of GaAsSb layer is equal to or greater than 0.5 nm/s. If these conditions are present, the GaAsSb quantum well layer is homogeneous (FIG. 10). The best result is acquired at the growth temperature of 700° C. and the growth rate of greater than 1.0 nm/s.

Comparative COD Performance of GaAsSb and InGaAs Based Devices

Structures of Device C (GaAsSb) and Device D (InGaAs)

The inventors tested the effectiveness of the present invention on preventing short term catastrophic optical damage (COD).

In this section, we show that a LD which has a uniform (homogeneous) GaAsSb well layer (Device C) does not degrade, compared with the InGaAs well layer LD (Device D).

Figure 15:
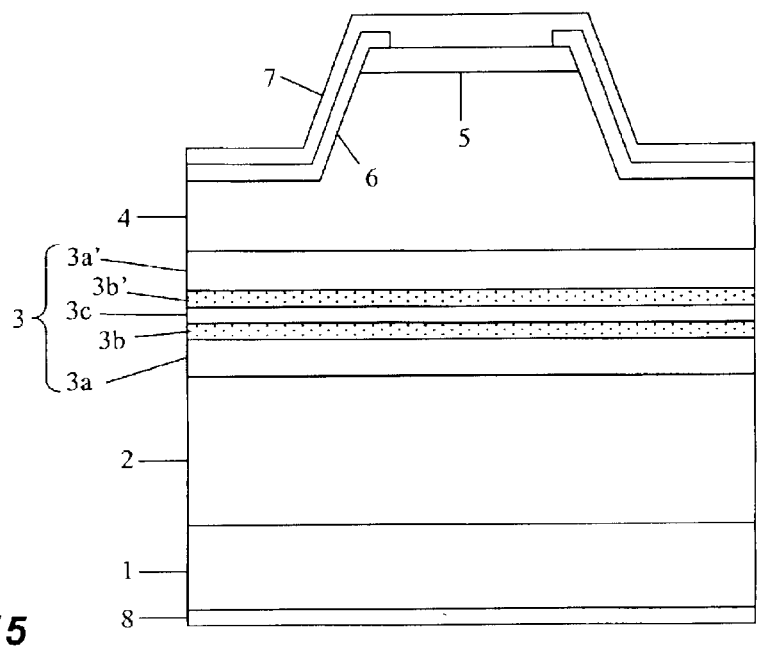
FIG. 15 is a cross-sectional view along the device width showing the layer structure of an exemplary semiconductor laser device C (GaAsSb-LD for COD-test) and D (InGaAs-LD for COD-test) according to the present invention.

An exemplary laser device according to the present invention having a ridge optical waveguide type and a Fabry-Perot cavity structure is shown in FIG. 15. Referring to the reference numbers in FIG. 15, laser Device C has the following exemplary layer structure. A 3-μm lower cladding layer 2 of, for example, n-$Al_{0.3}Ga_{0.7}As$ is laminated on a substrate 1 of n-cladding layer. An active region, or "active layer," is then formed over the optical confinement layer 3a by laminating the following series of layers:

a 60 nm GaAs optical confinement layer 3a on layer 2, a 7 nm first $GaAs_{1-x}Sb_x$ quantum well layer 3b on layer 3a (0.08≦x<0.2), a GaAs barrier layer 3c on layer 3b, a 7 nm second $GaAs_{1-x}Sb_x$ quantum well layer 3b' on layer 3c (0.08≦x<0.2), and a 60 nm GaAs optical confinement layer 3a ' on layer 3b'.

With a composition range of 0.08≦x<0.2 for the $GaAs_{1-x}Sb_x$ material, the quantum well layers 3b and 3b' have compressive strain of 0.5% to 1.5% with respect to the GaAs substrate, and emit light in the range of 940 nm to 1100 nm at room temperature.

Completing the device, a 2.5-μm upper cladding layer 4 of, for example, p-$Al_{0.3}Ga_{0.7}As$ and a cap layer 5 of, for example, p$^+$-GaAs are laminated on the SCH layer. Layers 4 and 5 are etched to form a mesa stripe shape by conventional masking and etching processes.

The top surface of the layer structure, excluding the top surface of the cap layer, is coated with a protective film 6 of, for example, silicon nitride (SiN). A p-type electrode 7 is formed in ohmic contact with the top surface of the cap layer 5 and an n-type electrode 8 is formed at the back of the substrate 1.

Device D is similarly constructed, except that the first and second quantum well layers 3b and 3b' comprise $In_{0.15}Ga_{0.85}As$ material.

Versions of Devices C and D were constructed with the waveguide structures having high optical confinement factors, so-called high Gamma test devices.

These LDs have a double quantum well (DQW) structure. The optical confinement factor (Γ) is 1.8% at each quantum well. Then, longitudinal optical fields are 194 nm (7 nm/1.8%, further divided by 2 for 2 wells) and $FFP_y$ angles are spread to 35 degrees. These devices have higher optical power densities than conventional pumping laser devices. Therefore, we could confirm the difference of the COD levels of Device C and D. The cavity lengths were 1200 μm, the ridge widths were about 12 μm, and the thicknesses of the optical confinement layers (GaAs) were 60 mm. No facet passivation was used. However, these LDs were encapsulated under-$N_2$ atmosphere, in order to prevent the oxidation of facets.

COD Experiment

Figure 16:
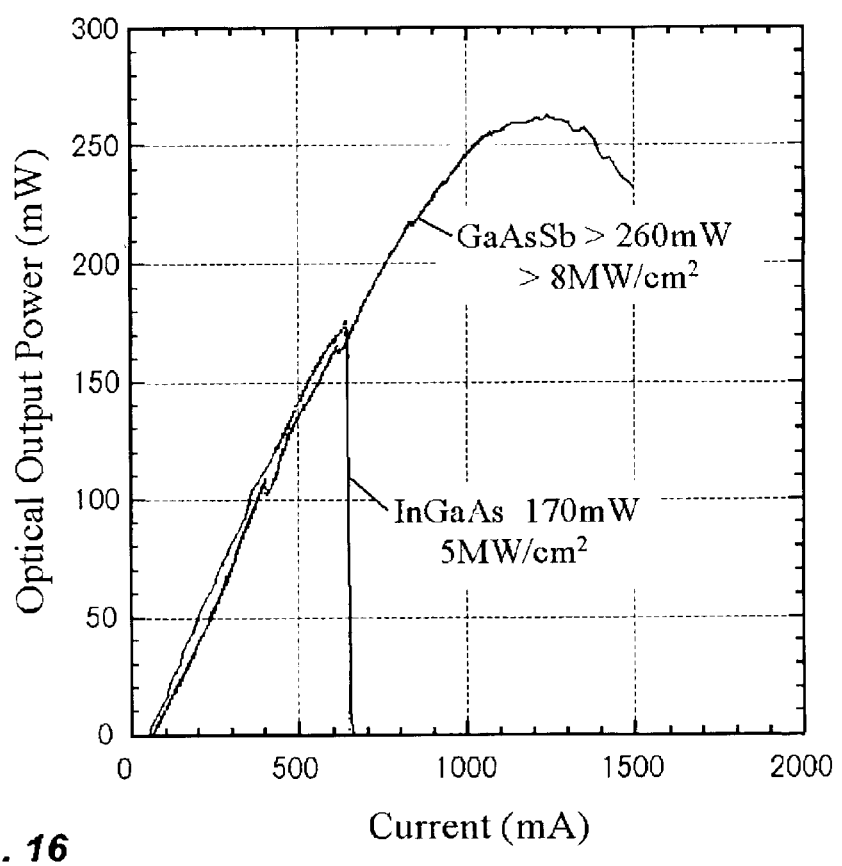
FIG. 16 is a graph showing the results of an acceleration test on the durability of the device to catastrophic optical destruction (COD), the I-L characteristics of a test-device C and a comparative test-device D according to the present invention.

The output power from each device is measured as the driving current to the device is gradually increased to the point where optical power ceases, or an upper current limit is reached. FIG. 16 shows the test result comparison between devices C and D. Comparative InGaAs Device D catastrophically failed at a driving current of 500 mA and an output power of 170 mW.

Device C according to the present invention was able to operate to the limit current of 1500 mA without failure, and reached an output power of 260 mW. Device C reached a peak power density of 8 megawatts per square centimeter, and Device D reached a peak power density of 5 megawatts per square centimeter.

The inventors believe that this comparison demonstrates that the GaAsSb quantum well layer has aided in suppressing the occurrence of COD.

Application of Inventions
<Fabrication of Device B (GaAsSb EDFA), Device B'(GaAsSb TDFA), and Device A (InGaAs EDFA)>

In this section, the inventors explain the fabrication process of a pump laser chip for EDFA and TDFA.

Figure 17:
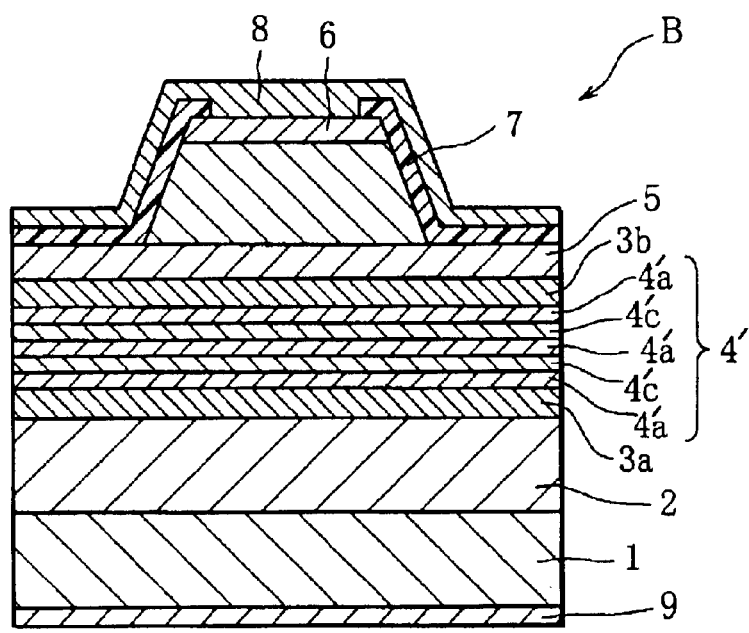
FIG. 17 is a cross-sectional view along the device width showing the layer structure for exemplary semiconductor laser device B (GaAsSb-LD for EDFA) and device B' (GaAsSb-LD for TDFA) according to the present invention.

The Device B shown in FIG. 17 was manufactured by MOCVD in the following manner.

A lower cladding layer 2 of n-Al0.3Ga$_{0.7}$As having a thickness of 3 μm was laminated on an n-GaAs substrate 1. The thick n-Al$_{0.3}$Ga$_{0.7}$As layer suppresses the substrate mode oscillations. A lower SCH layer 3a of non-doped Al$_{0.2}$Ga$_{0.8}$As having a thickness of 70 nm was laminated on the lower cladding layer 2. These layers may be formed by conventional MOCVD methods using conventional source and dopant gases.

Barrier layers 4a' of non-doped GaAs$_{0.9}$P$_{0.1}$ having a thickness of 10 nm and well layers 4c' of non-doped GaAs$_{0.9}$Sb$_{0.1}$ having a thickness of 7 nm were alternately laminated on the lower SCH layer 3a, thereby forming an active layer 4' which has two quantum wells. Then, an upper SCH layer 3b of non-doped Al$_{0.2}$Ga$_{0.8}$As having a thickness of 70 nm was laminated on the barrier layer 4a'. We can also replace the single SCH layer with the graded index guide SCH layer (GRIN-SCH).

Non-doped GaAs having thickness of 10 nm (or less) is also available for the barrier layers instead of GaAs$_{0.9}$P$_{0.1}$. The devices with barrier layers of GaAs$_{0.9}$P$_{0.1}$ are superior to the devices with the GaAs barriers under high temperature operation. Removal of these barrier layers, or insertion of the barrier layers that contain aluminum (Al), causes large threshold current because of poor interface with GaAsSb.

The GaAs$_{1-x}$Sb$_x$ quantum well layers 4c' (x=0.1) were grown at a temperature of 700° C. and a growth rate of 1.2 nm/sec using the source gases of tri-ethyl gallium (TEGa), tri-methyl-antimony (TMSb), and Arsine diluted by hydrogen (10% AsH$_3$+90% H$_2$). The flow rate of TEGa was 200 sccm (1.01 μmol/sec), the flow rate of TMSb was 121.6 sccm (1.1 μmol/sec), and the flow rate of 10% AsH$_3$+90% H$_2$ was 26 sccm (1.93 μmol/sec). Low pressure growth, of 76 Torr, has been employed.

The growth temperatures provided herein are measured at the substrate. Barrier layers 4a' were formed by conventional MOCVD methods using conventional source gases.

Next, an upper cladding layer 5 of p-Al$_{0.3}$Ga$_{0.7}$As having a thickness of 2.5 μm and a cap layer 6 of p$^+$-GaAs having a thickness of 350 nm were sequentially laminated on the upper SCH layer 3b to form a layer structure. These layers may be formed by conventional MOCVD methods using conventional source and dopant gases.

The spontaneous emission peak wavelength from the above structure is about 970 nm at room temperature. In this case, we can obtain 980 nm oscillation wavelength at 200 mW optical power. These results are adequate for the 980 nm pump LD.

Then, ordinary photo-lithography and etching were carried out to form a ridge optical waveguide, the entire top surface was coated with silicon nitride (SiN) 7 and an opening was made only in the top surface of the cap layer 6.

Then, a p-type electrode 8 was formed on the top surface and an n-type electrode 9 was formed at the back of the substrate 1.

Then, the structure was cleaved to a cavity length of L, and the cleaved facets were subjected to facet growth of InGaP to form facet protection layers. (While InGaP material is preferred, other semiconductor materials may also be used.) Then, an anti-reflective (AR) coating was formed on one of the facets, such as by depositing Al$_2$O$_3$, to form a front facet with a reflectance of 5%, and a high-reflective (HR) coating was formed on the other facet, such as by depositing a set of multiple alternating layers of SiO$_2$/Si, thereby forming a rear facet with a reflectance of 92%. Then, the bar separation process was carried out to provide the laser Device B of the present invention. A lengthwise cross-section of the device is provided in FIG. 18 to show the length L of the resonator cavity and the above-described facet layers.

For the purpose of comparison, a laser device A was produced with the same specification as that of the laser Device B, except that the material for the well layer was non-doped In$_{0.15}$Ga$_{0.85}$As.

It is well known that COD (or COMD: catastrophic optical mirror damage) at the facet could be suppressed by the insertion of a special passivation layer. In this invention, we used the 0.1 μm InGaP facet growth layer in order to prevent the COD.

Device B' was constructed to realize the 1040 nm emission wavelength required for TDFA. The construction and fabrication of device B' is substantially the same as that for Device B, except for the following differences:

the composition of the quantum well layer is 15% antimony (GaAs$_{0.85}$Sb$_{0.15}$), instead of 10% antimony, SCH layer 3a has a thickness of 75 nm, instead of 70 nm, SCH layer 3b has a thickness of 75 nm, instead of 70 nm, and The thicknesses of the AR coating and HR coating are adjusted to account for the change in lasing wavelength.

Figure 18:
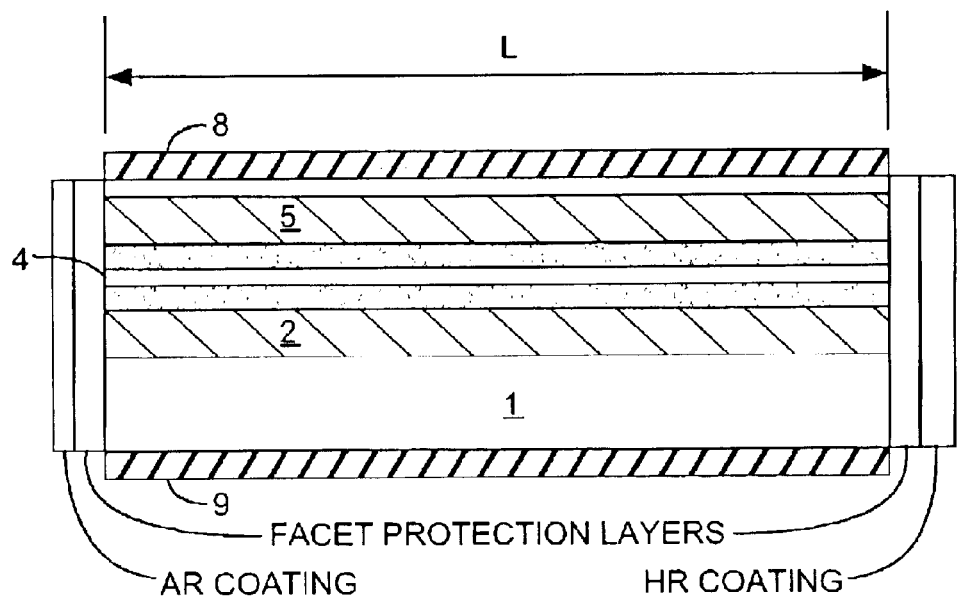
FIG. 18 is a cross-sectional view along the device length showing the layer structure for exemplary semiconductor laser device B (GaAsSb-LD for EDFA) and device B' (GaAsSb-LD for TDFA) according to the present invention.

The thicknesses of the quantum well layers are substantially the same for both of Devices B and B'. FIG. 18 exemplifies the lengthwise cross-section of Device B' as well.

In the case of fabrication of pump laser module with a fiber Bragg grating (FBG), the front facet reflection was designed to be under 1% in normal pump lasers, since the FBG has a high reflectivity (about 5%). In this section, the reflectivity of the front facet was set to 5% in order to investigate the characteristics of the LD with an FBG. Thus, we can measure the LD characteristics without having to use an FBG.

<Characteristics and Comparison>

(1) Threshold Current

The threshold currents of Devices B and A are 50 mA and 40 mA, respectively. The cavity length of each device is 1200 μm. The slope efficiencies of both devices are 0.95 W/A. From these results, it is found that the threshold current of Device B is slightly higher than that of Device A. However, other characteristics of laser diodes are almost the same. The far-field pattern (FFP) angles are also the same (FFP$_h$=5 degrees, FFP$_v$=25 degrees). These values are adequate for coupling the laser diode to a single mode fiber (SMF).

(2) I-L characteristics

Figure 19:
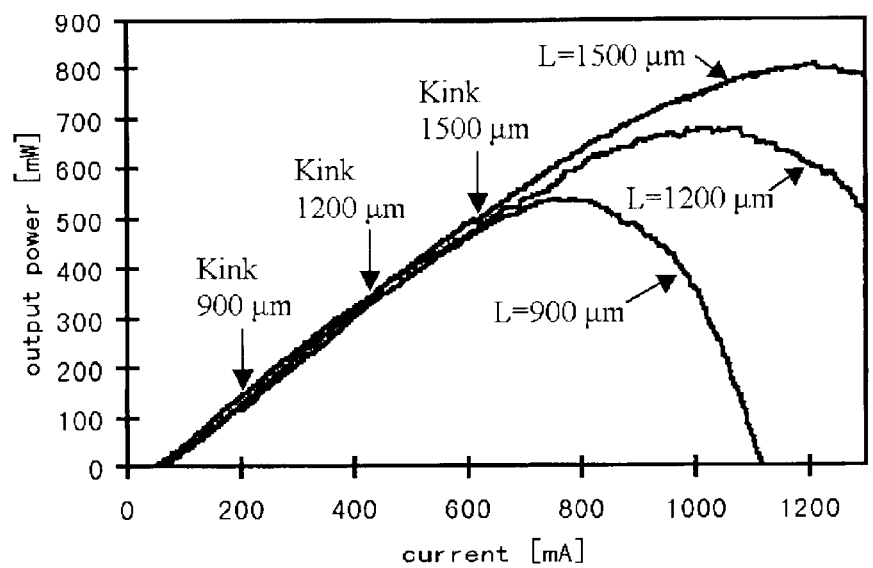
FIG. 19 is a graph showing the I-L characteristics of example devices B having cavity lengths of 900 $\mu$m, 1200 $\mu$m and 1500 $\mu$m, the devices being according to the present invention.

FIG. 19 shows the I-L characteristics of the laser Device B. We investigated the variation of I-L characteristics with respect to cavity length L.

The kink current, occurred by the generation of the second mode or the steering of the first mode, generally depends on the cavity length. The cavity lengths were 900 μm, 1200 μm and 1500 μm. The corresponding kink currents were 200 mA, 400 mA and 600 mA, respectively.

Thus, this invention can be applied to high power LD over 200 mW. It was found that for the present LD structure, a cavity length over 1200 μm is best for the application of high power lasers.

<Reliability at the Time of High-Power Driving over a Long Period of Time>

Figure 20:
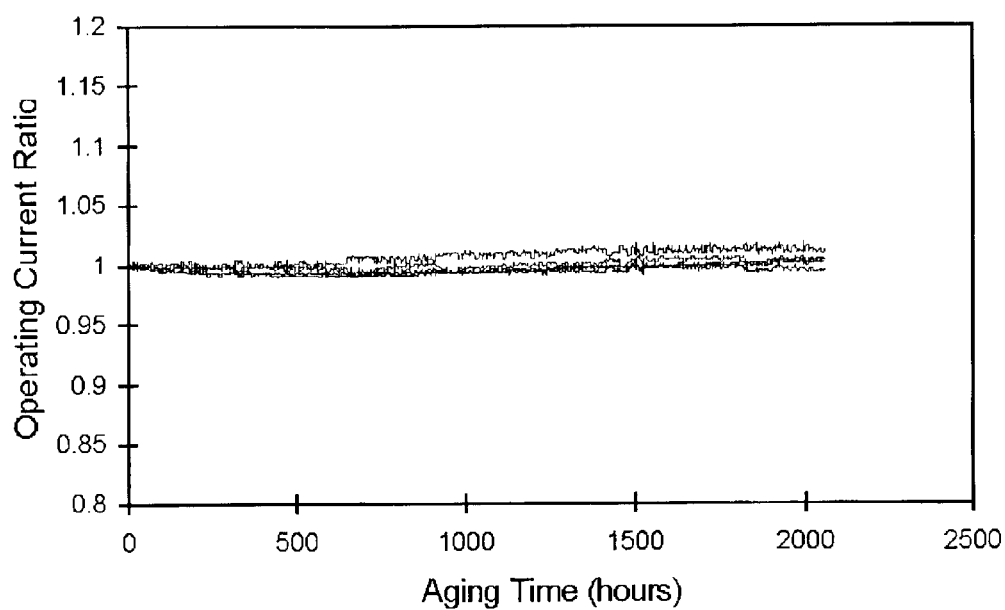
FIG. 20 is a graph showing the results of an acceleration test of the drive reliability of exemplary devices according to the present invention.

The following acceleration test was conducted on the example Device B. First, burn-in of each device was carried out for ninety hours at a temperature of 60° C. under the constant current of 500 mA (ACC: automatic current control condition), then each device was driven in such a way as to have a constant optical output of 400 mW at a temperature of 60° C. for 2000 hours (APC: automatic power control condition). FIG. 20 shows the results of the acceleration test (APC test).

As apparent from FIG. 20, the five example devices B (with InGaP facet growth) maintained the laser oscillation without degradation even though continuously driven for over 2000 hours. The ambient temperature during the acceleration is 60° C. Optical output power is 400 mW. In this test, we did not estimate the ratio of failure, because the number of LDs was small and driving time was short. However, the inventors believe that this test demonstrates that the use of GaAsSb for the quantum well layer has suppressed the effect of the degradation (LDDM).

<Pumping Laser Module>

Figure 21:
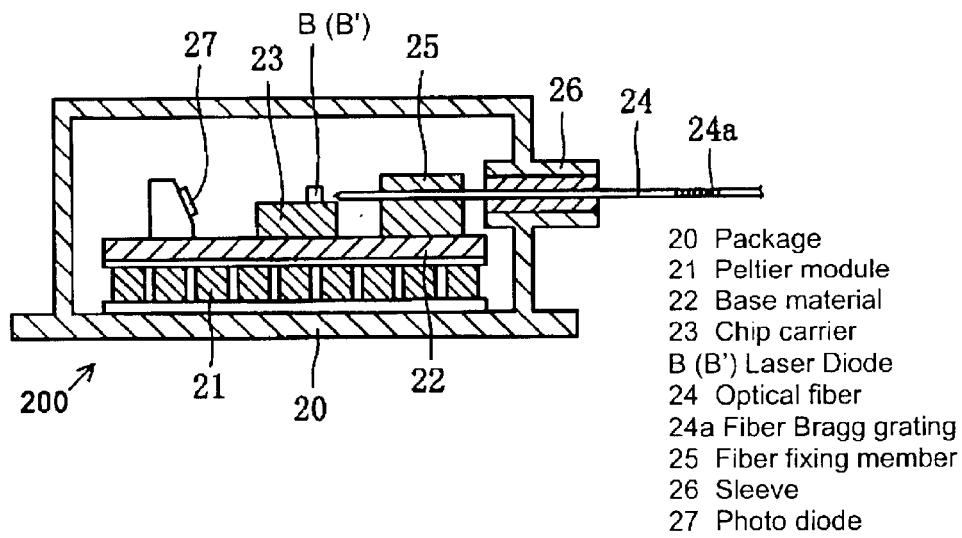
FIG. 21 shows an exemplary module structure according to the present invention.

Referring to FIG. 21, we fabricated the pump laser module 200 with the present invention. In this laser module, a Peltier cooler 21 was located above the plate of the package 20, and a base material 22 of, for example KOVAR, is placed on the Peltier cooler 21. Then, the laser chip (device B or device B') of the present invention was bonded to the base material using a chip carrier 23. In this structure, the laser was coupled to a single mode fiber (SMF) 24.

The SMF 24 was fixed on the base material 22, and the light was emitted through the sleeve 26 which was fixed on the package 20. A photo diode 27 was located at the back side of the laser diode (LD B or B') to monitor the optical power of the laser module.

A wedge type fiber was used in order to improve the optical coupling efficiency. The anti-reflectivity facet of the present invention LD was set around 1%, since the reflectivity of FBG (Fiber Bragg Grating) 24a is high, being about 5%.

The structure of the laser module is similar to that of the conventional InGaAs LD module. However, we can obtain a high reliability laser module, because the reliability of the GaAsSb active layer chip is improved as compared with the conventional InGaAs active layer chip.

<Fiber Amplifier Embodiments>

Figure 22:
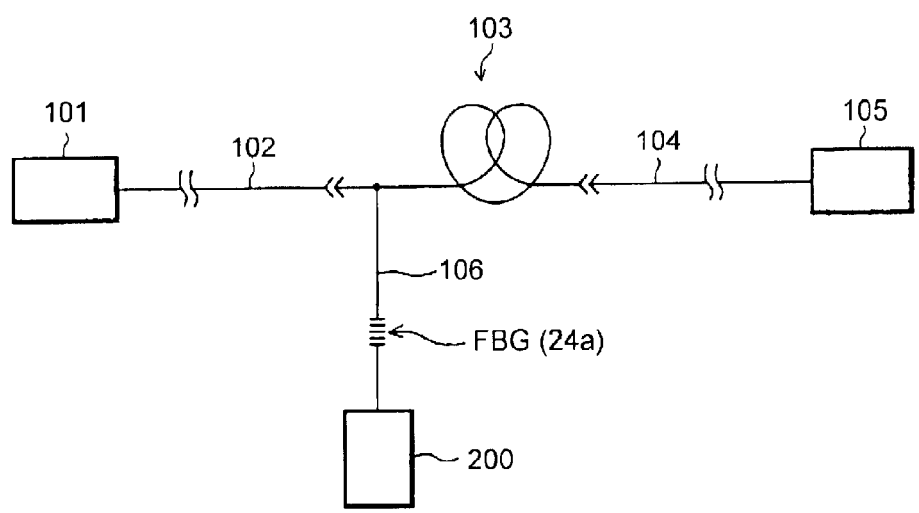
FIG. 22 shows an exemplary fiber amplifier (e.g., EDFA, TDFA, etc.) employing a device according to the present invention.

High reliability allows higher optical power operation. The present invention enables to perform the high optical power operation of laser module. Furthermore, we can realize the high reliability for fiber amplifiers, such as EDFA and TDFA, by the present invention. FIG. 22 shows a schematic diagram of a fiber amplifier. It comprises an optical signal source 101 that emits an optical signal beam having a wavelength in the 1.55 μm (C-band) or 1.47 μm (S-band) wavelength band, as measured in free space. The optical signal beam of source 101 is coupled to a fiber amplifier 103 (e.g., EDFA for C-band, TDFA for S-band, etc.) by way of an optical fiber 102. A pumping laser beam emitted from a pumping laser module 200 is introduced into the fiber amplifier 103 through an optical fiber 106. In this way, the optical signal can be amplified by virtue of the pumping laserbeam. As seen in FIG. 22, fiber amplifier 103 has two ends. While FIG. 22 shows optical fiber 106 being coupled to the signal input end of fiber amplifier 103, optical fiber 106 may also be coupled to the signal output end of fiber amplifier 103. In other words, the pumping light may be coupled to fiber amplifier 103 through either end of fiber amplifier 103. (Coupling of pumping light to both ends of an EDFA (or a TDFA) is also possible, but rarely done.)

A receiver-side optical fiber 104 is optically coupled to the output end (the emission side) of the fiber amplifier 103. The optical signal amplified in the fiber amplifier 103 enters the receiver-side optical fiber and is then transmitted through the fiber. Further, an optical receiver 105 is optically coupled at an end position on the downstream side of the receiver-side optical fiber 104.

In optical fiber 106, there is formed a fiber Bragg grating (24a), which is one exemplary embodiment of a wavelength selector. The Bragg grating is designed to reflect light with a wavelength in the pumping band of the fiber amplifier (e.g., within 20 nm of 0.98 μm for EDFA, and within 20 nm of 1.06 μm for TDFA). The wavelength values presented herein are given for the light as measured in free space. The pumping band of an EDFA generally encompasses wavelengths within 20 nm of 0.98 μm, and the pumping band of a TDFA generally encompasses wavelengths within 20 nm of 1.06 μm. The optical signals being amplified by EDFAs and TDFAs generally have wavelengths that are within 100 nm of 1.55 μm or 1.47 μm, which we call the signal band of the fiber amplifier.

Generalized Embodiments of the Present Invention

While the inventors prefer to use an antimony range of 8% to 20% in their 980 nm band pumping lasers, values less than 8% may be used for other emission bands and other device applications. As indicated previously with regard to FIG. 5, for composition values with x between ~0.03 and ~0.11, and in the temperature range from 200° C. to 800° C., the material can be thermodynamically stable in either of the solid states $(\alpha_1+\alpha_2)$ and $\alpha_2$. Thus, when working in this composition range, the growth temperature should be kept below the phase transition line between the $(\alpha_1+\alpha_2)$ and $\alpha_2$ phases.

Figure 23:
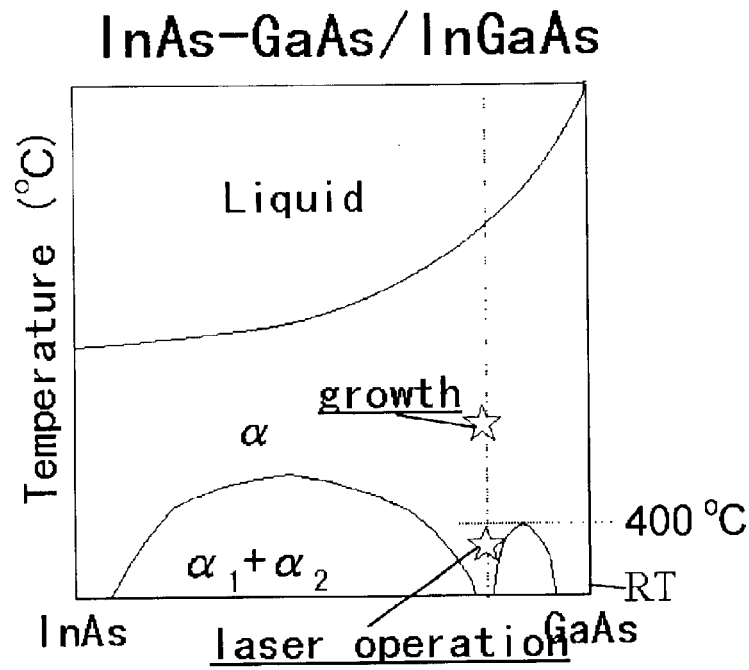
FIGS. 23–24 show additional phase diagrams of additional exemplary compound semiconductor systems exemplifying additional aspects of the present invention.

A further embodiment of the present invention comprises an InGaAs quantum well layer grown on a substantially lattice matched InGaAs substrate (indium content generally ranging from 10% to 20%). 980 nm emission can be obtained from this system. The phase diagram for InGaAs material system on this ternary substrate is shown in FIG. 23. The phase diagram has a solid $\alpha$ and a mixed crystal solid phase $(\alpha_1+\alpha_2)$, with the solid phase a extending in a trough (i.e., valley) through the mixed crystal phase $(\alpha_1+\alpha_2)$ at low temperature along the lattice matching line. (The lattice matching line is defined by the lattice constant of the ternary substrate.) This trough enables a quantum well layer having a composition near the lattice matching line to be grown and operated in the same equilibrium phase ($\alpha$). This is indicated on the figure by exemplary growth and operation points on the lattice matching line. A laser device according to this embodiment may employ any of the layer structures illustrated herein (e.g., FIGS. 7, 13, 15, 17), and use InGaAs, GaAs, AlGaAs and GaAsP materials for the layers above and below the quantum well layers (e.g., barrier layers, optical confinement layers, cladding layers, cap layer, and buffer layer).

It is believed by the inventors that the trough is due to the lattice matching ternary substrate, and that the combination of a quantum well layer with a substantially lattice-matched ternary substrate can be applied to other material systems to achieve similar results. As applied to this general embodiment, the term "substantially lattice-matched" means lattice constants that are within 1% of one another, and the term "ternary" means that least 2% of each constituent element is present. The ternary substrate and the ternary quantum well layer may be from different compound semiconductor systems.

Figure 24:
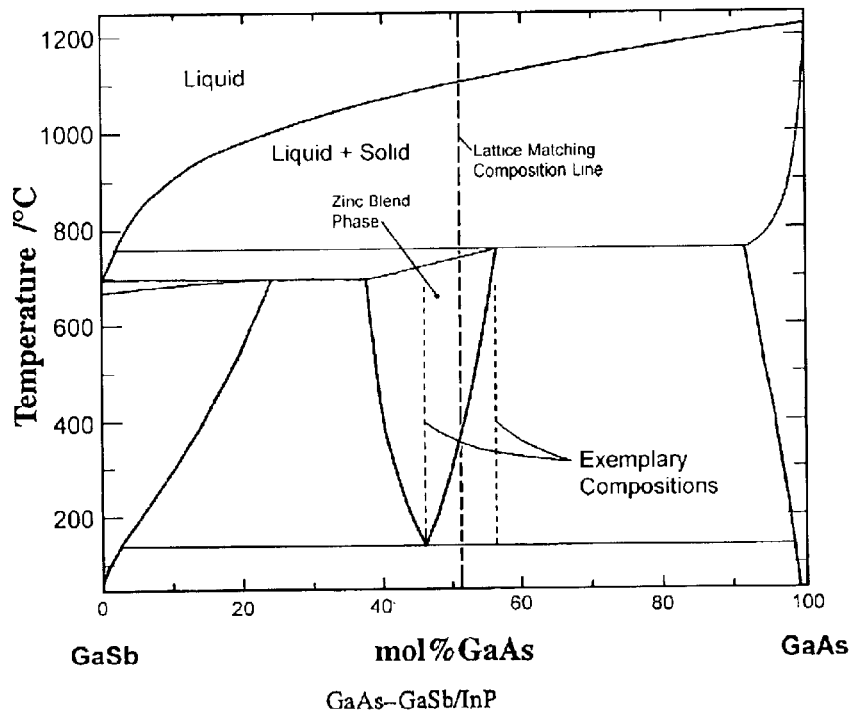

A further embodiment of the present invention comprises GaAsSb layers for distributed Bragg reflectors (DBRs) grown on an InP substrate for 1.55 μm vertical cavity laser embodiments (VCSELs). Since the light output of VCSEL traverses through the DBRs, the DBRs should also have the same thermodynamic stability to avoid the heating and concomitant damages. FIG. 24 shows the approximate phase diagram for this material system with a layer thickness of around 10 nm. It has a liquid phase, a liquid+solid phase, and several solid phases below these phases. There is a zinc-blend phase near the middle of the diagram, and two solid phases on either side. These three solid phases generally extend between 100° C. and 700° C., and provide a number of compositions which are thermodynamically stable at the growth and operating temperatures. Two such compositions are indicated in the figure, one in the zinc-blend phase at approximately 46% GaAs, and one in the right-adjacent phase at approximately 56% GaAs. Although FIG. 25 shows the approximate locations of these solid phases, appropriate composition lines can be readily determined experimentally by growing several different laser devices at different composition values, and then driving the lasers at accelerated conditions to find those compositions which have substantially fewer failures.

In each of the above embodiments, small amounts of nitrogen and indium can be added to the quantum well layers to reduce stress and provide other benefits. The nitrogen atoms are limited to a percentage of 2% or less with respect to total column-V atoms. The indium atoms are limited to a percentage of 2% or less with respect to total column-III atoms. Other column-III and column-V elements may be similarly added (each being limited to 2% or less).

In the above embodiments, each well layer is formed in an equilibrium phase that is thermo-dynamically stable at 200° C., 150° C., 100° C., and lower in many cases. Growth conditions and growth rates in many of the examples can be selected to form the well layer with a substantially homogeneous disordered microstructure. The growth temperatures are 400° C. and above, and more typically 500° C. and above, and 600° C. and above. The material systems of most of the examples have a plurality of solid equilibrium phases in their phase diagrams, and many composition lines pass through two or more solid phases through the temperature range of 100° C. to 800° C. In this temperature range, such compositions can exist in at least one of two or more different solid equilibrium phases, depending upon temperature.

The above generalized device embodiments may be used in the modules and fiber amplifier embodiments previously described.

The above embodiments are preferably applied to pumping laser devices where it is desirable to obtain optical power outputs of 200 mW or more from edge-emitting lasers structure that emit light in a single transverse mode. Such a device has a resonator cavity disposed parallel to the substrate surface (as illustrated in FIG. 18), and end facets on either end of the cavity. The cavity length is generally greater than 1000 μm, and more preferably greater than 1200 μm. Along at least a majority of the cavity length, and preferably along at least 1000 μm of cavity length, the width of the cavity is set to values which can only support a single transverse mode. The high output power and the confinement of the light to single transverse mode increase the optical power density and heat at the front facet. The present invention is, therefore, effective in improving the long term operation characteristics of these devices.

As apparent from the foregoing description, the well layer of the semiconductor device according to the present invention is formed of, for example, GaAsSb, a semiconductor material which does not change the phase in the temperature range from the temperature $(T_1)$ at the time of epitaxial growth to the temperature $(T_2)$ at the time the laser device is driven, the laser device does not show degradation even if the laser device is driven to produce high power of 200 mW or higher over a long period of time and has an excellent drive reliability.

What is claimed is:

1. A semiconductor laser device comprising:
    a semiconductor substrate; and
    an active layer structure disposed above the semiconductor substrate and having at least one quantum well layer, the at least one quantum well layer comprising GaAsSb in a form which has a substantially homogeneous disordered microstructure, and there is no disordered microstructure between the at least one quantum well layer and at least one of a barrier layer and a SCH layer.

2. The semiconductor laser device of claim 1 wherein the percentage of antimony atoms in the at least one well layer with respect to total column-V atoms is greater than or equal to 8% and less than 20%.

3. The semiconductor laser device of claim 1 wherein the active layer structure further comprises barrier layers disposed on either side of the at least one quantum well layer, each barrier layer having a composition different from the at least one quantum well layer.

4. The semiconductor laser device of claim 3, wherein each of said barrier layer comprises one of GaAs and GaAsP.

5. The semiconductor laser device of claim 1 further comprising a first facet, a second facet, a resonator cavity disposed between the first and second facets and parallel to the surface of the substrate, and a cavity length between the first and second facets, wherein at least a portion of the active layer is disposed within the resonator cavity, and wherein the cavity length is 1200 μm or more.

6. The semiconductor laser device of claim 1 further comprising a first facet, a second facet, a resonator cavity disposed between the first and second facets and parallel to the surface of the substrate, and a passivation layer disposed on the first facet.

7. The semiconductor laser device of claim 6 wherein the passivation layer comprises InGaP.

8. The semiconductor laser device of claim 1 wherein the at least one quantum well layer has a peak photoluminescence wavelength in the range of 920 nm to 1100 nm.

9. The semiconductor laser device of claim 1 wherein the at least one quantum well layer further comprises one or more additional column-III elements, the atoms of each additional column-III element being in a percentage of less than or equal to 2% with respect to total column-III atoms.

10. The semiconductor laser device of claim 9 wherein the at least one quantum well layer further comprises one or more additional column-V elements, the atoms of each additional column-V element being in a percentage of less than or equal to 2% with respect to total column-V atoms.

11. The semiconductor laser device of claim 1 wherein the at least one quantum well layer further comprises one or more additional column-V elements, the atoms of each additional column-V element being in a percentage of less than or equal to 2% with respect to total column-V atoms.

12. The semiconductor laser device of claim 1 wherein the at least one quantum well layer further comprises nitrogen atoms in a percentage of less than or equal to 2% with respect to total column-V atoms.

13. The semiconductor laser device of claim 1 wherein the at least one quantum well layer further comprises indium atoms in a percentage of less than or equal to 2% with respect to total column-III atoms.

14. The semiconductor laser device of claim 1 wherein the device emits light with a power level of more than 200 mW.

15. The semiconductor laser device according to claim 1, wherein said semiconductor laser device is of a facet emitting type having a Fabry-Perot cavity structure disposed parallel to the surface of the substrate.

16. The semiconductor laser device according to claim 15, wherein the device emits light having an oscillation wavelength in the range of 920 nm to 1100 nm.

17. A fiber amplifier of the EDFA or TDFA type, comprising:
    a fiber doped with Eribium or Thulium; and
    a semiconductor laser device that includes
        a semiconductor substrate, and
        an active layer structure disposed above the semiconductor substrate and having at least one quantum well layer, the at least one quantum well layer comprising GaAsSb in a form which has a substantially homogeneous disordered microstructure, said semiconductor laser device having an optical output that is coupled to an end of the fiber, wherein and there is no disordered microstructure between the at least one quantum well layer and at least one of a barrier layer and a SCH layer.

18. A semiconductor laser module comprising:
    a carrier substrate;
    a semiconductor laser device that includes
        a semiconductor substrate, and
        an active layer structure disposed above the semiconductor substrate and having at least one quantum well layer, the at least one quantum well layer comprising GaAsSb in a form which has a substantially homogeneous disordered microstructure disposed on the carrier substrate, wherein and there is no disordered microstructure between the at least one quantum well layer and at least one of a barrier layer and a SCH layer;
    an optical fiber; and
    a package holding the carrier substrate and the semiconductor laser device in a fixed relation to the optical fiber.

19. A semiconductor device, said device comprising:
    a semiconductor substrate; and
    a layer structure formed on said semiconductor substrate and having a first layer, said first layer comprising a compound semiconductor which belongs to a ternary compound semiconductor system, the system having a plurality of equilibrium phases as a function of temperature and composition of its constituent elements, said first layer being formed in a first one of the equilibrium phases, the first one of the equilibrium phases being a mixed-crystal solid and being thermodynamically stable at 150° C., and there is no disordered microstructure between the first layer and at least one of a barrier layer and a SCH layer.

20. The semiconductor device of claim 19 wherein said fist layer is formed with a substantially homogeneous disordered microstructure.

21. The semiconductor device of claim 19 wherein the semiconductor device is operated at a junction temperature of 100° C. or less.

22. The semiconductor device of claim 19 wherein the compound semiconductor of the first layer can be epitaxially grown in the first one of the equilibrium phases at a temperature which is above 500° C.

23. The semiconductor device of claim 19 wherein the first one of the equilibrium phases is thermodynamically stable at a temperature which is above 500° C.

24. The semiconductor device of claim 19 wherein the compound semiconductor of the first layer has a composition which enables the compound semiconductor to exist in at least one of two or more solid equilibrium phases in the temperature range of 150° C. to 800° C., depending upon temperature.

25. The semiconductor device of claim 26 herein the III–V compound semiconductor system has a plurality of solid equilibrium phases as a function of temperature and composition of its constituent elements.

26. The semiconductor laser device according to claim 19 wherein said semiconductor laser device comprises a facet emitting type having a Fabry-Perot cavity structure.

27. The semiconductor laser device according to claim 19 wherein the substrate comprises a ternary III–V compound semiconductor material which has substantially the same lattice constant as the first layer.

28. The semiconductor laser device of claim 19 wherein the first layer further comprises one or more additional column-III elements, the atoms of each additional column-III element being in a percentage of less than or equal to 2% with respect to total column-III atoms.

29. The semiconductor laser device of claim 28 wherein the first layer further comprises one or more additional column-V elements, the atoms of each additional column-V element being in a percentage of less than or equal to 2% with respect to total column-V atoms.

30. The semiconductor laser device of claim 19 wherein the first layer further comprises one or more additional column-V elements, the atoms of each additional column-V element being in a percentage of less than or equal to 2% with respect to total column-V atoms.

31. The semiconductor laser device of claim 19 wherein the first layer further comprises nitrogen atoms in a percentage of less than or equal to 2% with respect to total column-V atoms.

32. The semiconductor laser device of claim 19 wherein the first layer further comprises indium atoms in a percentage of less than or equal to 2% with respect to total column-III atoms.

* * * * *